(12) United States Patent
Thibado et al.

(10) Patent No.: US 12,163,508 B2
(45) Date of Patent: Dec. 10, 2024

(54) ENERGY HARVESTING DEVICES AND SENSORS, AND METHODS OF MAKING AND USE THEREOF

(71) Applicant: BOARD OF TRUSTEES OF THE UNIVERSITY OF ARKANSAS, Little Rock, AR (US)

(72) Inventors: Paul Thibado, Fayetteville, AR (US); Pradeep Kumar, Fayetteville, AR (US)

(73) Assignee: BOARD OF TRUSTEES OF THE UNIVERSITY OF ARKANSAS, Little Rock, AR (US)

( * ) Notice: Subject to any disclaimer, the term of this patent is extended or adjusted under 35 U.S.C. 154(b) by 1387 days.

(21) Appl. No.: 16/472,430

(22) PCT Filed: Dec. 21, 2017

(86) PCT No.: PCT/US2017/067798
§ 371 (c)(1),
(2) Date: Jun. 21, 2019

(87) PCT Pub. No.: WO2018/119180
PCT Pub. Date: Jun. 28, 2018

(65) Prior Publication Data
US 2021/0135600 A1 May 6, 2021

Related U.S. Application Data

(60) Provisional application No. 62/438,327, filed on Dec. 22, 2016.

(51) Int. Cl.
*F03G 7/08* (2006.01)
*G01H 11/08* (2006.01)
(Continued)

(52) U.S. Cl.
CPC ............... *F03G 7/08* (2013.01); *G01H 11/08* (2013.01); *H02N 1/08* (2013.01); *H02N 2/186* (2013.01);
(Continued)

(58) Field of Classification Search
CPC .......... H02N 1/08; H02N 2/186; G01H 11/08; G01H 1/00; H10N 30/306; H10N 30/308;
(Continued)

(56) References Cited

U.S. PATENT DOCUMENTS 7,279,686 B2  10/2007  Schneiker
7,839,058 B1  11/2010  Churchill et al.
(Continued)

FOREIGN PATENT DOCUMENTS

CL  200501653  5/2006
CN  103856149  6/1914
(Continued)

OTHER PUBLICATIONS

Bao et al., "Ripple Texturing of Suspended Graphene Atomic Membranes," Mar. 3, 2009, https://doi.org/10.48550/arXiv.0903.0414 (Year: 2009).*

(Continued)

*Primary Examiner* — Tulsidas C Patel
*Assistant Examiner* — Joshua Kiel M Rodriguez
(74) *Attorney, Agent, or Firm* — Meunier Carlin & Curfman LLC

(57) ABSTRACT

Disclosed herein are energy harvesting devices and sensors, and methods of making and use thereof. The energy harvesting devices can comprise a membrane disposed on a substrate, wherein the membrane comprises a two-dimensional (2D) material and one or more ripples; and a component electrically, magnetically, and/or mechanically coupled to the membrane and/or the substrate, such that the
(Continued)

component is configured to harvest energy from the membrane. The sensors can comprise a membrane disposed on a substrate, wherein the membrane comprises a two-dimensional material one or more ripples; and a component electrically, magnetically, and/or mechanically coupled to the membrane and/or the substrate, such that the component is configured to detect a signal from the membrane.

17 Claims, 24 Drawing Sheets

(51) Int. Cl.
    *H02N 1/08*           (2006.01)
    *H02N 2/18*           (2006.01)
    *H10N 30/30*         (2023.01)

(52) U.S. Cl.
    CPC ......... *H10N 30/306* (2023.02); *H10N 30/308* (2023.02)

(58) Field of Classification Search
    CPC . F03G 7/06; F03G 7/08; B81B 3/0027; B81B 3/007; B81B 2201/038; B81B 2203/0127; H02K 35/02
    See application file for complete search history.

(56) References Cited

U.S. PATENT DOCUMENTS

| | | | |
|---|---|---|---|
| 9,142,857 | B2 | 9/2015 | Lee et al. |
| 2007/0276444 | A1* | 11/2007 | Gelbart ................ A61N 1/3785 607/6 |
| 2012/0267899 | A1* | 10/2012 | Huffman ................ H02N 2/186 290/1 R |
| 2012/0283807 | A1 | 11/2012 | Deterre et al. |
| 2012/0312102 | A1 | 12/2012 | Alvarez et al. |
| 2013/0140950 | A1* | 6/2013 | Fuentes-Fernandez ...................... H10N 30/85 310/319 |
| 2013/0193930 | A1 | 8/2013 | Baugher |
| 2013/0214875 | A1 | 8/2013 | Duncan et al. |
| 2013/0313943 | A1 | 11/2013 | Duncan et al. |
| 2015/0115331 | A1* | 4/2015 | Moon .................. B81B 3/0021 257/254 |
| 2015/0115767 | A1 | 4/2015 | Pinkerton et al. |
| 2015/0188030 | A1* | 7/2015 | Andosca ................ H02N 2/186 310/329 |
| 2015/0249257 | A1* | 9/2015 | Liu ......................... H01M 8/16 429/401 |
| 2016/0111978 | A1 | 4/2016 | Kim et al. |
| 2016/0211828 | A1 | 7/2016 | Simmonds et al. |
| 2016/0315561 | A1 | 10/2016 | Shin et al. |
| 2016/0346556 | A1 | 12/2016 | Slepian et al. |
| 2019/0386584 | A1 | 12/2019 | Thibado |
| 2021/0336480 | A1 | 10/2021 | Thibado |

FOREIGN PATENT DOCUMENTS

| | | |
|---|---|---|
| CN | 103840710 | 6/2014 |
| CN | 104067087 A | 9/2014 |
| JP | 2016086599 | 5/2016 |
| JP | 2016208816 A | 12/2016 |
| KR | 101199117 B1 | 2/2012 |
| KR | 20120074556 A | 7/2012 |
| KR | 1187312 B1 * | 10/2012 |
| KR | 10-2016-0125276 | 10/2016 |
| WO | 2013190744 A1 | 12/2013 |
| WO | 2013192335 A1 | 12/2013 |
| WO | 2015163178 A1 | 10/2015 |
| WO | 2016061155 A | 4/2016 |
| WO | 2016128625 | 8/2016 |
| WO | 2019232232 A1 | 12/2019 |
| WO | 2021216870 A1 | 10/2021 |

OTHER PUBLICATIONS

De Lima et al., "Soliton instability and fold formation in laterally compressed graphene," Jan. 8, 2015, Nanotechnology, vol. 26, No. 4 (Year: 2015).*
Akinwande et al., "A Review on Mechanics and Mechanical Properties of 2D Materials—Graphene and Beyond," Nov. 4, 2016, https://doi.org/10.48550/arXiv.1611.01555 (Year: 2016).*
Guo et al., "Energy Harvesting with Single-Ion-Selective Nanopores: A Concentration-Gradient-Driven Nanofluidic Power Source," Mar. 25, 2010, Advanced Functional Materials, vol. 20, No. 8 (Year: 2010).*
Shen et al., "One Step Synthesis of Graphene Oxide-Magnetic Nanoparticle Composite," Jan. 4, 2010, The Journal of Physical Chemistry C, vol. 114, No. 3 (Year: 2010).*
Sari et al., "An Energy Harvesting MEMS Frequency Detector," 2007, IEEE Sensors 2007 Conference (Year: 2007).*
Wang and Deval, "Periodic ripples in suspended graphene," Mar. 23, 2011, Physical Review B, vol. 83, No. 12 (Year: 2011).*
Abedpour et al., "Irreversibility in response to forces acting on graphene sheets," May 12, 2010, Physical Review Letters, vol. 104, No. 19 (Year: 2010).*
English translation of KR-1187312-B1 (Year: 2012).*
P. M. Thibado, Charging capacitors using graphene fluctuations. Dated: Jan. 12, 2022. 5 pages.
Extended European Search Report issued for Application No. 19812598.1, dated Jun. 15, 2021.
Examination Report issued for Indian Application No. 201927027079, dated Dec. 24, 2021.
Examination Report issued for Australian Application No. 2017379071, dated Feb. 22, 2022.
Office Action issued for Japanese Application No. 2019-534118, dated Feb. 25, 2022.
Office Action issued for Eurasian Application No. 201991516, dated Apr. 19, 2022.
A. Einstein, Investigations on the theory of the Brownian movement, Annalen der Physik, 17 (1905) 549-560.
A. Fasolino, J.H. Los, M.I. Katsnelson, Intrinsic ripples in graphene, Nature Materials, 6 (2007) 858-861.
A.A. Balandin, S. Ghosh, W. Bao, I. Calizo, D. Teweldebrhan, F. Miao, C.N. Lau, Superior thermal conductivity of single-layer graphene, Nano Lett., 8 (2008) 902-907.
A.L. Cottrill, A.T. Liu, Y. Kunai, V.B. Koman, A. Kaplan, S.G. Mahajan, P.W. Liu, A.R. Toland, M.S. Strano, Ultra-high thermal effusivity materials for resonant ambient thermal energy harvesting, Nature Communications, 9 (2018) 664.
Bonilla, M. Ruiz-Garcia, Critical radius and temperature for buckling in graphene, Physical Review B, 93 (2016) 115407.
C. Lotze, M. Corso, K.J. Franke, F. von Oppen, J.I. Pascual, Driving a Macroscopic Oscillator with the Stochastic Motion of a Hydrogen Molecule, Science, 338 (2012) 779-782.
C.B. Williams, R.B. Yates, Analysis of a micro-electric generator for microsystems, Transducers, (1995) 369.
E.V. Castro, H. Ochoa, M.I. Katsnelson, R.V. Gorbachev, D.C. Elias, K.S. Novoselov, A.K. Geim, F. Guinea, Limits on Charge Carrier Mobility in Suspended Graphene due to Flexural Phonons, Physical Review Letters, 105 (2010) 266601.
H.H. Hasegawa, C.B. Li, Y. Ohtaki, Thermodynamics of a system with long-time correlations, International Journal of Quantum Chemistry, 98 (2004) 138-144.
I.A. Martinez, E. Roldan, L. Dinis, D. Petrov, J.M.R. Parrondo, R.A. Rica, Brownian Carnot engine, Nature Physics, 12 (2016) 67-70.
J. Macaulay, M. Kuckelhaus, Internet of things in logistics, Matthais Heutger (2015).
J. Tersoff, D.R. Hamann, Theory of the Scanning Tunneling Microscope, Physical Review B, 31 (1985) 805-813.
J.C. Meyer, A.K. Geim, M.I. Katsnelson, K.S. Novoselov, T.J. Booth, S. Roth, The structure of suspended graphene sheets, Nature, 446 (2007) 60-63.
J.F. Xu, P.M. Thibado, Z. Ding, 4 K, ultrahigh vacuum scanning tunneling microscope having two orthogonal tips with tunnel junctions as close as a few nanometers, Rev. Sci. Instrum., 77 (2006) 093703.

(56) References Cited

OTHER PUBLICATIONS

J.-S. Rattinacannou, A promising new energy source: The Brownian motion of nanoresonator arrays European Physical Journal, 79 (2014) 01006.
L. Gammaitoni, P. Hanggi, P. Jung, F. Marchesoni, Stochastic resonance, Rev. Mod. Phys., 70 (1998) 223-287.
M. Lopez-Suarez, R. Rurali, L. Gammaitoni, G. Abadal, Nanostructured graphene for energy harvesting, Physical Review B, 84 (2011) 161401(R).
M. Neek-Amal, P. Xu, J.K. Schoelz, M.L. Ackerman, S.D. Barber, P.M. Thibado, A. Sadeghi, F.M. Peeters, Thermal mirror buckling in freestanding graphene locally controlled by scanning tunneling microscopy, Nat. Comm., 5 (2014) 4962.
M. Ruiz-Garcia, L.L. Bonilla, A. Prados, Ripples in hexagonal lattices of atoms coupled to Glauber spins, Journal of Statistical Mechanics—Theory and Experiment, (2015) P05015.
M. Ruiz-Garcia, L.L. Bonilla, A. Prados, STM-driven transition from rippled to buckled graphene in a spin-membrane model, Physical Review B, 94 (2016) 205404.
M.B. Lundeberg, J.A. Folk, Rippled Graphene in an In-Plane Magnetic Field: Effects of a Random Vector Potential, Physical Review Letters, 105 (2010) 146804.
M.L. Ackerman, P. Kumar, M. Neek-Amal, P.M. Thibado, F.M. Peeters, S. Singh, Anomalous Dynamical Behavior of Freestanding Graphene Membranes, Physical Review Letters, 117 (2016) 126801.
M.O. Magnasco, Forced Thermal Ratchets, Physical Review Letters, 71 (1993) 1477-1481.
M.R. Sorensen, A.F. Voter, Temperature-accelerated dynamics for simulation of infrequent events, Journal of Chemical Physics, 112 (2000) 9599-9606.
N. Mounet, M. Gibertini, P. Schwaller, D. Campi, A. Merkys, A. Marrazzo, T. Sohier, I.E. Castelli, A. Cepellotti, G. Pizzi, N. Marzari, Two-dimensional materials from high-throughput computational exfoliation of experimentally known compounds, Nature Nanotechnology, 13 (2018) 246-252.
N.R. Greene, Energy Flow for a Variable-Gap Capacitor, The Physics Teacher, 43 (2005) 340.
P. San-Jose, J. Gonzalez, F. Guinea, Electron-Induced Rippling in Graphene, Physical Review Letters, 106 (2011) 045502.
P. Xu, M. Neek-Amal, S.D. Barber, J.K. Schoelz, M.L. Ackerman, P.M. Thibado, A. Sadeghi, F.M. Peeters, Unusual ultra-low-frequency fluctuations in freestanding graphene, Nat. Comm., 5 (2014) 3720.
R. O'Donnell, N. Schofield, A.C. Smith, J. Cullen, Design Concepts for High-Voltage Variable-Capacitance DC Generators, IEEE Transactions on Industry Applications, 45 (2009) 1778-1784.
R.D. Astumian, Thermodynamics and kinetics of a Brownian motor, Science, 276 (1997) 917-922.
S. Hanson, M. Seok, Y.S. Lin, Z. Foo, D. Kim, Y. Lee, N. Liu, D. Sylvester, D. Blaauw, A Low-Voltage Processor for Sensing Applications with Picowatt Standby Mode, IEEE Journal of Solid-State Circuits, 44 (2009) 1145-1155.
S. Roundy, P.K. Wright, J. Rabaey, A study of low level vibrations as a power source for wireless sensor nodes, Computer Communications, 26 (2003) 1131-1144.
S.F. Philp, Vacuum-Insulated, Varying-Capacitance Machine, IEEE Transactions on Electrical Insulation, 12 (1977) 130-136.
U. Seifert, Stochastic thermodynamics, fluctuation theorems and molecular machines, Reports on Progress in Physics, 75 (2012) 126001.
P. Langevin, On the theory of Brownian motion, C. R. Acad. Sci. (Paris) 146, 530-533 (1908).
T. Li, S. Kheifets, D. Medellin, and M. G. Raizen, Measurement of the instantaneous velocity of a Brownian particle, Science 328, 1673 (2010).
S. Stapf, R. Kimmich, and R. O. Seitter, Proton and Deuteron Field-Cycling NMR Relaxometry of Liquids in Porous Glasses: Evidence for Lévy-Walk Statistics, Phys. Rev. Lett. 75, 2855 (1995).
H. Katori, S. Schlipf, and H. Walther, Anomalous Dynamics of a Single Ion in an Optical Lattice, Phys. Rev. Lett. 79, 2221 (1997).
M. F. Shlesinger, G. M. Zaslavsky, and J. Klafter, Strange kinetics, Nature (London) 363, 31 (1993).
R. Metzler and J. Klafter, The random walk's guide to anomalous diffusion: A fractional dynamics approach, Phys. Rep. 339, 1-77 (2000).
G. M. Viswanathan, S. V. Buldyrev, S. Havlin, M. G. E. da Luz, E. P. Raposo, and H. E. Stanley, Optimizing the success of random searches, Nature (London) 401, 911 (1999).
I. Kosztin and K. Schulten, Fluctuation-Driven Molecular Transport through an Asymmetric Membrane Channel, Phys. Rev. Lett. 93, 238102 (2004).
D. F. Bocian and S. I. Chan, NMR studies of membrane structure and dynamics, Annu. Rev. Phys. Chem. 29, 307 (1978).
J. Pecreaux, H. G. Dobereiner, J. Prost, J. F. Joanny, and P. Bassereau, Refined contour analysis of giant unilamellar vesicles, Eur. Phys. J. E 13, 277 (2004).
A. Naji, P. J. Atzberger, and F. L. H. Brown, Hybrid Elastic and Discrete-Particle Approach to Biomembrane Dynamics with Application to the Mobility of Curved Integral Membrane Proteins, Phys. Rev. Lett. 102, 138102 (2009).
E. Reister-Gottfried, S. M. Leitenberger, and U. Seifert, Diffusing proteins on a fluctuating membrane: Analytical theory and simulations, Phys. Rev. E 81, 031903 (2010).
J. K. Schoelz, P. Xu, V. Meunier, P. Kumar, M. Neek Amal, P. M. Thibado, and F. M. Peeters, Graphene ripples as a realization of a two-dimensional Ising model: A scanning tunneling microscope study, Phys. Rev. B 91, 045413 (2015).
P. Xu, Y. Yang, S. D. Barber, M. L. Ackerman, J. K. Schoelz, D. Qi, I. A. Kornev, L. Dong, L. Bellaiche, S. Barraza-Lopez, and P. M. Thibado, Atomic control of strain in freestanding graphene, Phys. Rev. B 85, 121406(R) (2012).
J. H. Los, M. I. Katsnelson, O. V. Yazyev, K. V. Zakharchenko, and A. Fasolino, Scaling properties of flexible membranes from atomistic simulations: Application to graphene, Phys. Rev. B 80, 121405(R) (2009).
B. S. Swartzentruber, Direct Measurement of Surface Diffusion Using Atom-Tracking Scanning Tunneling Microscopy, Phys. Rev. Lett. 76, 459 (1996).
P. Haenggi and F. Marchesoni, Artificial Brownian motors: Controlling transport on the nanoscale, Rev. Mod. Phys. 81, 387 (2009).
Paradiso, Joseph A., and Thad Starner. "Energy scavenging for mobile and wireless electronics." IEEE Pervasive computing 1 (2005): 18-27.
Moore, Gordon E. "No exponential is forever: but"Forever" can be delayed! [semiconductor industry]." 2003 IEEE International Solid-State Circuits Conference, 2003. Digest of Technical Papers. ISSCC. IEEE, 2003.
Erturk, A. and D. J. Inman (2008). "A distributed parameter electromechanical model for cantilevered piezoelectric energy harvesters." Journal of vibration and acoustics 130/041002-1.
Erturk, A. and D. J. Inman (2009). "An experimentally validated bimorph cantilever model for piezoelectric energy harvesting from base excitations." Smart materials and structures 18: 025009.
Joon Kim, K., F. Cottone, et al. (2010). "Energy scavenging for energy efficiency in networks and applications." Bell Labs Technical Journal 15(2): 7-29.
Wang, Lei, and F. G. Yuan. "Energy harvesting by magnetostrictive material (MsM) for powering wireless sensors in SHM." Sensors and Smart Structures Technologies for Civil, Mechanical, and Aerospace Systems 2007. vol. 6529. International Society for Optics and Photonics, 2007, 11 pages.
Beeby, S., R. Torah, et al. (2007). "A micro electromagnetic generator for vibration energy harvesting." Journal of Micromechanics and Microengineering 17: 1257.
Mitcheson, P. D., E. M. Yeatman, et al. (2008). "Energy harvesting from human and machine motion for wireless electronic devices." Proceedings of the IEEE 96(9): 1457-1486.
Roundy, S., P. K. Wright, et al. (2004). Energy Scavenging for Wireless Sensor Networks with special focus on Vibrations, Kluwer Academic Publisher.

(56) References Cited

OTHER PUBLICATIONS

Poulin, G., E. Sarraute, et al. (2004). "Generation of electrical energy for portable devices Comparative study of an electromagnetic and a piezoelectric system." Sensors & Actuators: A. Physical 116(3): 461-471.
Beeby, S. P., M. J. Tudor, et al. (2006). "Energy harvesting vibration sources for microsystems applications." Measurement Science and Technology 17(12): R175-R195.
Zhu, D., M. J. Tudor, et al. (2010). "Strategies for increasing the operating frequency range of vibration energy harvesters: a review." Measurement Science and Technology 21: 022001.
Jang, Kwang Yeop, James Lee, and Dong-Gun Lee. "Magneto-Thermo-Triboelectric Generator (MTTG) for thermal energy harvesting." Active and Passive Smart Structures and Integrated Systems 2016. vol. 9799. International Society for Optics and Photonics, 2016, 7 pages.
International Search Report and the Written Opinion issued for Application No. PCT/US2019/034688, dated Aug. 9, 2019, 11 pages.
International Search Report and the Written Opinion issued for Application No. PCT/US2017/067798, dated Mar. 6, 2018, 9 pages.
International Preliminary Report on Patentability issued for Application No. PCT/US2017/067798, dated Jul. 4, 2019.
Flexible nanoantenna arrays capture abundant solar energy (Aug. 11, 2008) retrieved Dec. 28, 2020 from https://phys.org/news/2008-08-flexible-nanoantenna-arrays-capture-abundant.html.
Gadalla, Mena N., M. Abdel-Rahman, and Atif Shamim. "Design, optimization and fabrication of a 28.3 THz nano-rectenna for infrared detection and rectification." Scientific reports 4.1 (2014): 4270, 1-9.
Extended European Search Report issued for Application No. 17882960.2, dated Jun. 30, 2020.
First Examination issued for Indian Application No. 202027056747, dated Sep. 9, 2022.
Notice of allowance issued for U.S. Appl. No. 16/427,023, dated Sep. 6, 2022.
Corrected Notice of allowance issued for U.S. Appl. No. 16/427,023, dated Sep. 21, 2022.
Notice of allowance issued for U.S. Appl. No. 16/427,023, dated May 2, 2023.
Notice of allowance issued for U.S. Appl. No. 16/427,023, dated Sep. 26, 2023.
Office Action issued for Korean Application No. 10-2019-7019472, dated Jul. 29, 2022.
Office Action for Canadian Application No. 3,048,117, dated May 30, 2024.
English translation of Office Action issued for Chinese Application No. 201780080103.5, dated Aug. 23, 2022.
English translation of Search Report issued for Chinese Application No. 201780080103.5, dated Aug. 23, 2022.
English translation of Office Action issued for Chinese Application No. 201780080103.5, dated Apr. 26, 2023.
Examination Report issued for Australian Application No. 2017379071, dated Aug. 29, 2022.
Examination Report issued for Australian Application No. 2019278835, dated Apr. 4, 2024.
Communication Pursuant to Article 94(3) EPC issued in EP17882960.2, dated Aug. 30, 2022.
Communication Pursuant to Article 94(3) EPC issued in EP17882960.2, dated Mar. 26, 2024.
Communication Pursuant to Article 94(3) EPC issued in EP19812598.1, dated Dec. 11, 2023.
English translation of Office Action issued for Korean Application No. 10-2019-7019472, dated Apr. 18, 2023.
English translation of Office Action issued for Peruvian Application No. 1309-2019, dated Apr. 27, 2023.
English translation of Office Action issued for Colombian Application No. NC2020/0016155 dated Oct. 9, 2023.
English translation of Office Action issued for Chinese Application No. 201980050473.3, dated Jun. 1, 2023.
English translation of Search Report issued for Chinese Application No. 201980050473.3, dated Jun. 1, 2023.
Office Action issued for AP Application No. AP/P/2020/012887, dated Jun. 14, 2022.
Decision to Grant issued for AP Application No. AP/P/2020/012887, dated Feb. 23, 2024.
English summary of Office Action issued for Mexican Application No. MX/a/2019/007158, dated Jun. 20, 2023.
M. L. Ackerman, et al., "Anomalous Dynamical Behavior of Freestanding Graphene Membranes" Physical Review Letters, vol. 117, Sep. 16, 2016, pp. 126801-1-126801-5.

* cited by examiner

ENERGY HARVESTING DEVICES AND SENSORS, AND METHODS OF MAKING AND USE THEREOF

CROSS-REFERENCE TO RELATED APPLICATION

This application is a national stage application filed under 35 U.S.C. § 371 of PCT/US2017/067798 filed Dec. 21, 2017, which claims priority to and benefit of U.S. Provisional Patent Application No. 62/438,327 filed Dec. 22, 2016, which is hereby incorporated by reference herein in its entirety.

FIELD

The disclosed technology generally relates to energy harvesting devices and sensors, and methods of making and use thereof.

BACKGROUND

Vibration energy harvesting is the practice of capturing vibration energy from external vibration sources (e.g. vehicles, machines, buildings, and human motions). This captured energy can then be used for various applications. In certain approaches to vibration energy harvesting, a plate is fixed at one end and will vibrate up and down between two extremes when it is excited. By flexing and oscillating between the two extremes, the strain/stress developed on the surface of the plate can be used to generate energy. Vibrations at the atomic scale are omnipresent, even in a mechanically quiet environment. This is due to the material being held at some temperature above absolute zero, and are called thermal vibrations. It is with respect to these and other considerations that the various embodiments described below are presented.

SUMMARY

In accordance with the purposes of the disclosed devices and methods, as embodied and broadly described herein, the disclosed subject matter relates to energy harvesting devices and sensors, and methods of making and use thereof.

The energy harvesting devices and sensor can comprise a membrane comprising a two-dimensional (2D) material disposed on a substrate, wherein the membrane comprises one or more ripples. The two-dimensional material can, for example, comprise graphene, $MoS_2$, $MoSe_2$, $WS_2$, $WSe_2$, $ReS_2$, $ReSe_2$, or a combination thereof. In certain examples, the two-dimensional material can comprise graphene. The membrane can, for example, have an average thickness of from 0.3 nanometers (nm) to 3.0 nm. The membrane can, for example, have an average lateral dimension of from 0.1 microns to 100 microns. In some examples, the membrane can have a tension per unit length of from 0.0 N/m to 10.0 N/m. The one or more ripples can, for example, have an average length of from 1 nm to 100 nm. In some examples, the one or more ripples can have an average height of from 0.1 nm to 2.0 nm.

The substrate can, for example, comprise copper, silicon, sapphire, or a combination thereof. In some examples, the substrate can comprise a grid comprising one or more apertures.

The energy harvesting devices further comprise a component electrically, magnetically, and/or mechanically coupled to the membrane and/or the substrate, such that the component is configured to harvest energy from the membrane.

In some examples, the substrate is thermally conductive and the membrane is in thermal contact with the substrate, wherein the thermal energy of the substrate can be converted into a vibration of the membrane such that the membrane has a vibrational energy, and the component is configured to convert the vibrational energy of the membrane into electrical, magnetic, and/or mechanical energy, thereby harvesting energy from the membrane. In some examples, the thermal energy can comprise ambient thermal energy. In some examples, the membrane can have a vibrational energy and the component is configured to convert the vibrational energy of the membrane into electrical, magnetic, and/or mechanical energy, thereby harvesting energy from the membrane. In some examples, the vibrational energy comprises ambient vibrational energy. The vibrational energy can, for example, comprise vibrations having a frequency of from 0.1 milliHertz (mHz) to 10 gigaHz (GHz).

In some examples, the energy harvesting device can be configured such that each of the one or more ripples can produce a power of from 1 picoWatt (pW) to 100 pW. In some examples, the energy harvesting device can have a power density of from 1 $W/m^2$ to 100,000 $W/m^2$.

In some examples, the membrane can have an electrical charge and the component comprises a capacitor disposed around and electrically coupled to the membrane, wherein the capacitor is configured to convert the vibrational energy of the charged membrane into an alternating electrical current, thereby harvesting energy from the membrane. In some examples, the device can further comprise a diode bridge circuit to convert the alternating electrical current into a direct electrical current. The device can, for example, further comprise a capacitor electrically coupled to the diode bridge, such that the direct current can charge the capacitor, thereby storing the charge generated by the vibrational energy of the charged membrane.

In some examples, the membrane can further comprise a plurality of magnetic particles. The plurality of magnetic particles can, for example, comprise iron, cobalt, niobium, manganese, nickel, or a combination thereof. In some examples, the plurality of magnetic particles can comprise iron oxide, cobalt oxide, or a combination thereof. The plurality of magnetic particles can, for example, have an average particle size of from 0.5 nm to 10 nm. In some examples, the component can comprise an electrode loop magnetically coupled to the membrane, wherein the device is configured to convert the vibrational energy of the membrane into a time-varying magnetic field which induces an electrical current in the electrode loop, thereby converting the vibrational energy of the membrane into an electrical current and harvesting energy from the membrane. The device can, for example, further comprise a capacitor electrically coupled to the electrode loop, such that the energy harvested by the device can be stored in the capacitor.

In some examples, the component can comprise a piezoelectric cantilever and the membrane has an edge that is mechanically coupled to the piezoelectric cantilever, wherein the piezoelectric cantilever is configured to convert the vibrational energy of the membrane into electrical energy, thereby harvesting energy from the membrane. The device can, for example, further comprises a capacitor electrically coupled to the piezoelectric cantilever, such that the energy harvested by the device can be stored in the capacitor.

In some examples, the membrane can be piezoelectric and the component comprises a voltage readout mechanically and electrically coupled to the membrane, wherein the piezoelectric membrane is configured to convert vibrational energy into electrical energy, which can be harvested by the voltage readout. The device can, for example, further comprise a capacitor electrically coupled to the voltage readout, such that the energy harvested by the device can be stored in the capacitor.

In some examples, the component can comprise a box pump mechanically coupled to the membrane and/or the substrate, wherein the box pump comprises a first one-way fluid flow valve and a second one-way fluid flow valve, and wherein the box pump is configured to convert vibrational energy of the membrane into flow of a fluid through the box pump via the first one-way fluid flow valve and/or the second one-way fluid flow valve, thereby converting the vibrational energy of the membrane to fluid flow, and harvesting energy from the membrane.

In some examples, the membrane can further comprise a channel that traverses the membrane. The component can, for example, comprise a ratchet-style transporter mechanically coupled to the membrane, wherein the ratchet-style transporter is configured convert the vibrational energy of the membrane into translation of the ratchet-style transporter, such that the ratchet-style transporter can be transported from one side of the membrane to the other via the channel upon vibration of the membrane, thereby converting the vibrational energy of the membrane into translation energy of the ratchet-style transporter, and harvesting energy from the membrane.

Also disclosed herein are sensors, the sensors further comprising a component electrically, magnetically, and/or mechanically coupled to the membrane and/or the substrate, such that the component is configured to detect a signal from the membrane. In some examples, the substrate is thermally conductive and the membrane is in thermal contact with the substrate, wherein the substrate is configured to convert thermal energy into vibration of the membrane such that the membrane has a vibrational energy, and the component is configured detect a signal produced by the vibrational energy of the membrane. The thermal energy can, for example, comprise ambient thermal energy. In some examples, the membrane has a vibrational energy and the component is configured to detect a signal produced by the vibrational energy of the membrane. The vibrational energy can, for example, comprise ambient vibrational energy. The vibrational energy can, for example, comprise vibrations having a frequency of from 0.1 mHz to 10 GHz. The component can comprise an electrode electrically coupled to the membrane and/or substrate. In some examples, the electrode can be configured to detect a frequency of the vibrational energy of the membrane, such that the sensor is configured to detect a change in mass of the membrane based on a change in the frequency of vibration of the membrane. In some examples, the electrode can be configured to detect a magnitude of a voltage signal from the membrane such that the sensor is configured to detect a change in charge of the membrane based on a change in the magnitude of the signal detected from the membrane.

Also disclosed herein are methods of making the energy harvesting devices and sensors described herein. For example, the methods of making the energy harvesting devices and/or sensors described herein can comprise: compressing a sheet of the two-dimensional material to form the membrane; disposing the membrane on the substrate; and electrically, magnetically, and/or mechanically coupling the component to the membrane and/or the substrate.

Compressing the sheet of the two-dimensional material can, for example, comprise applying a lateral compression force across the sheet, wherein the lateral compression force has a magnitude of from 1 nanoNewton (nN) to 100 nN. In some examples, the sheet of two-dimensional material has an original length and the compressed sheet of the two-dimensional material has a compressed length, wherein the compressed length is shorter than the original length by an amount of from 0.01% to 1%.

Also disclosed herein are methods of use of the energy harvesting devices and/or sensors described herein. For example, also disclosed herein are methods of harvesting energy using the energy harvesting devices described herein.

Additional advantages of the disclosed devices and methods will be set forth in part in the description which follows, and in part will be obvious from the description. The advantages of the disclosed devices will be realized and attained by means of the elements and combinations particularly pointed out in the appended claims. It is to be understood that both the foregoing general description and the following detailed description are exemplary and explanatory only and are not restrictive of the disclosed devices and methods, as claimed.

The details of one or more embodiments of the invention are set forth in the accompanying drawings and the description below. Other features, objects, and advantages of the invention will be apparent from the description and drawings, and from the claims.

BRIEF DESCRIPTION OF THE DRAWINGS

The accompanying drawings, which are incorporated and constitute a part of this specification, illustrate several aspects of the disclosure, and together with the description, serve to explain the principles of the disclosure.

DETAILED DESCRIPTION

Figure 1:
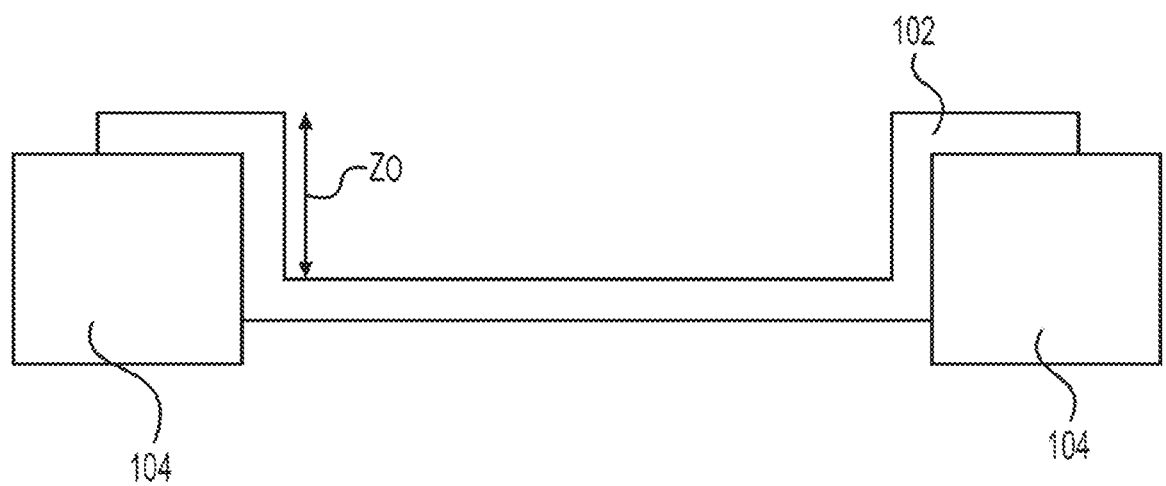
FIG. 1 is a schematic diagram of a graphene membrane disposed on a substrate comprising a copper grid.

The devices and methods described herein may be understood more readily by reference to the following detailed description of specific aspects of the disclosed subject matter and the Examples included therein.

Before the present devices and methods are disclosed and described, it is to be understood that the aspects described below are not limited to the details of construction and arrangement of components set forth in the following description or illustrated in the drawings. The disclosed technology is capable of other embodiments and of being practiced or carried out in various ways.

In the following description, references are made to the accompanying drawings that form a part hereof and that show, by way of illustration, specific embodiments or examples.

It is also to be understood that the terminology used herein is for the purpose of describing particular aspects only and is not intended to be limiting. In describing example embodiments, terminology will be resorted to for the sake of clarity. It is intended that each term contemplates its broadest meaning as understood by those skilled in the art and includes all technical equivalents that operate in a similar manner to accomplish a similar purpose. It is also to be understood that the mention of one or more steps of a method does not preclude the presence of additional method steps or intervening method steps between those steps expressly identified. Steps of a method may be performed in a different order than those described herein without departing from the scope of the disclosed technology. Similarly, it is also to be understood that the mention of one or more components in a device or system does not preclude the presence of additional components or intervening components between those components expressly identified.

Also, throughout this specification, various publications are referenced. The disclosures of these publications in their entireties are hereby incorporated by reference into this application in order to more fully describe the state of the art to which the disclosed matter pertains. The references disclosed are also individually and specifically incorporated by reference herein for the material contained in them that is discussed in the sentence in which the reference is relied upon.

Definitions

In this specification and in the claims that follow, reference will be made to a number of terms, which shall be defined to have the following meanings:

Throughout the description and claims of this specification the word "comprise" and other forms of the word, such as "comprising" and "comprises," means including but not limited to, and is not intended to exclude, for example, other additives, components, integers, or steps.

As used in the description and the appended claims, the singular forms "a," "an," and "the" include plural referents unless the context clearly dictates otherwise. Thus, for example, reference to "a composition" includes mixtures of two or more such compositions, reference to "the compound" includes mixtures of two or more such compounds, reference to "an agent" includes mixture of two or more such agents, and the like.

It is understood that throughout this specification the identifiers "first" and "second" are used solely to aid the reader in distinguishing the various components, features, or steps of the disclosed subject matter. The identifiers "first" and "second" are not intended to imply any particular order, amount, preference, or importance to the components or steps modified by these terms.

The term "or combinations thereof" as used herein refers to all permutations and combinations of the listed items preceding the term. For example, "A, B, C, or combinations thereof" is intended to include at least one of: A, B, C, AB, AC, BC, or ABC, and if order is important in a particular context, also BA, CA, CB, CBA, BCA, ACB, BAC, or CAB. Continuing with this example, expressly included are combinations that contain repeats of one or more item or term, such as BB, AAA, AB, BBC, AAABCCCC, CBBAAA, CABABB, and so forth. The skilled artisan will understand that typically there is no limit on the number of items or terms in any combination, unless otherwise apparent from the context.

Energy Harvesting Devices and Sensors

Described herein are energy harvesting devices 100 and sensors 140. The energy harvesting devices 100 and sensors can comprise a membrane 102 disposed on a substrate 104, wherein the membrane 102 comprises a two-dimensional (2D) material and one or more ripples.

In an example embodiment, an energy harvesting device 100 having a power source for ambient vibration energy harvesting is disclosed, having an atomic two-dimensional membrane 102 for buckling at a relatively low frequency. The anomalous vibrational kinetic energy of these two-dimensional materials, if used as the active component of an energy harvesting device 100, can provide superior energy production when compared to existing technology. For example, in current silicon microelectromechanical (MEM) vibration energy harvesting technology, the active component may be an etch silicon platform. This platform will not spontaneously vibrate or mechanically buckle because it is too rigid. "Mechanical buckling" is understood in this disclosure as non-linear phenomenon. The prior approaches of silicon MEM structures are linear response devices. In contrast, the membrane 102 of the energy harvesting devices 100 described herein can spontaneously vibrate and mechanically buckle.

The two-dimensional material can, for example, comprise graphene, $MoS_2$, $MoSe_2$, $WS_2$, $WSe_2$, $ReS_2$, $ReSe_2$, or a combination thereof. In certain examples, the two-dimensional material can comprise graphene.

The identity of the two-dimensional material can be selected based on a variety of factors. For example, the bending stiffness varies between the different two-dimensional materials and therefore different vibration frequencies would be available. Also, the electrical conductivity of the various two-dimensional materials varies considerably, which can control the efficiency of harvesting energy using an electrostatic approach. Accordingly, the identity of the two-dimensional material can be selected to control one or more of these parameters.

In some examples, the membrane 102 can comprise freestanding graphene which has a substantially large velocity component in the velocity probability distribution. In some examples, the membrane 102 can exhibit perpetual non-linear movement at room temperature.

The membrane 102 can, for example, have an average thickness of 0.3 nanometers (nm) or more (e.g., 0.4 nm or more, 0.5 nm or more, 0.6 nm or more, 0.7 nm or more, 0.8 nm or more, 0.9 nm or more, 1.0 nm or more, 1.1 nm or more, 1.2 nm or more, 1.3 nm or more, 1.4 nm or more, 1.5 nm or more, 1.6 nm or more, 1.7 nm or more, 1.8 nm or more, 1.9 nm or more, 2.0 nm or more, 2.1 nm or more, 2.2 nm or more, 2.3 nm or more, 2.4 nm or more, or 2.5 nm or more). In some examples, the membrane 102 can have an average thickness of 3.0 nm or less (e.g., 2.9 nm or less, 2.8 nm or less, 2.7 nm or less, 2.6 nm or less, 2.5 nm or less, 2.4 nm or less, 2.3 nm or less, 2.2 nm or less, 2.1 nm or less, 2.0 nm or less, 1.9 nm or less, 1.8 nm or less, 1.7 nm or less, 1.6 nm or less, 1.5 nm or less, 1.4 nm or less, 1.3 nm or less, 1.2 nm or less, 1.1 nm or less, 1.0 nm or less, 0.9 nm or less, 0.8 nm or less, 0.7 nm or less, 0.6 nm or less, or 0.5 nm or less). The average thickness of the membrane 102 can range from any of the minimum values described above to any of the maximum values described above. For example, the membrane 102 can have an average thickness of from 0.3 nm to 3.0 nm (e.g., from 0.3 nm to 2.5 nm, from 0.3 nm to 2.0 nm, from 0.3 nm to 1.5 nm, form 0.3 nm to 1.0 nm, or from 0.3 nm to 0.6 nm).

The membrane 102 can, for example, have an average lateral dimension of 0.1 microns (μm) or more (e.g., 0.5 μm or more, 1 μm or more, 1.5 μm or more, 2 μm or more, 2.5 μm or more, 3 μm or more, 3.5 μm or more, 4 μm or more, 4.5 μm or more, 5 μm or more, 6 μm or more, 7 μm or more, 8 μm or more, 9 μm or more, 10 μm or more, 15 μm or more, 20 μm or more, 25 μm or more, 30 μm or more, 35 μm or more, 40 μm or more, 45 μm or more, 50 μm or more, 60 μm or more, 70 μm or more, or 80 μm or more). In some examples, the membrane 102 can have an average lateral dimension of 100 μm or less (e.g., 90 μm or less, 80 μm or less, 70 μm or less, 60 μm or less, 50 μm or less, 45 μm or less, 40 μm or less, 35 μm or less, 30 μm or less, 25 μm or less, 20 μm or less, 15 μm or less, 10 μm or less, 9 μm or less, 8 μm or less, 7 μm or less, 6 μm or less, 5 μm or less, 4.5 μm or less, 4 μm or less, 3.5 μm or less, 3 μm or less, 2.5 μm or less, 2 μm or less, 1.5 μm or less, or 1 μm or less). The average lateral dimension of the membrane 102 can range from any of the minimum values described above to any of the maximum values described above. For example, the membrane 102 can have an average lateral dimension of from 0.1 microns to 100 microns (e.g., from 0.1 μm to 50 μm, from 50 μm to 100 μm, from 0.1 μm to 20 μm, from 20 μm to 40 μm, from 40 μm to 60 μm, from 60 μm to 80 μm, from 80 μm to 100 μm, from 0.5 μm to 95 μm, or from 10 μm to 90 μm).

In some examples, the membrane 102 can have a tension per unit length of 0.0 Newtons per meter (N/m) or more (e.g., 0.01 N/m or more, 0.02 N/m or more, 0.03 N/m or more, 0.04 N/m or more, 0.05 N/m or more, 0.06 N/m or more, 0.07 N/m or more, 0.08 N/m or more, 0.09 N/m or more, 0.10 N/m or more, 0.11 N/m or more, 0.12 N/m or more, 0.13 N/m or more, 0.14 N/m or more, 0.15 N/m or more, 0.20 N/m or more, 0.25 N/m or more, 0.30 N/m or more, 0.35 N/m or more, 0.40 N/m or more, 0.45 N/m or more, 0.50 N/m or more, 0.60 N/m or more, 0.70 N/m or more, 0.80 N/m or more, 0.90 N/m or more, 1.0 N/m or more, 1.5 N/m or more, 2.0 N/m or more, 2.5 N/m or more, 3.0 N/m or more, 3.5 N/m or more, 4.0 N/m or more, 4.5 N/m or more, 5.0 N/m or more, 6.0 N/m or more, or 7.0 N/m or more). In some examples, the membrane 102 can have a tension per unit length of 10.0 N/m or less (e.g., 9.0 N/m or less, 8.0 N/m or less, 7.0 N/m or less, 6.0 N/m or less, 5.0 N/m or less, 4.5 N/m or less, 4.0 N/m or less, 3.5 N/m or less, 3.0 N/m or less, 2.5 N/m or less, 2.0 N/m or less, 1.5 N/m or less, 1.0 N/m or less, 0.90 N/m or less, 0.80 N/m or less, 0.70 N/m or less, 0.60 N/m or less, 0.50 N/m or less, 0.45 N/m or less, 0.40 N/m or less, 0.35 N/m or less, 0.30 N/m or less, 0.25 N/m or less, 0.20 N/m or less, 0.15 N/m or less, 0.14 N/m or less, 0.13 N/m or less, 0.12 N/m or less, 0.11 N/m or less, 0.10 N/m or less, 0.09 N/m or less, 0.08 N/m or less, 0.07 N/m or less, 0.06 N/m or less, or 0.05 N/m or less). The tension per unit length of the membrane 102 can range from any of the minimum values described above to any of the maximum values described above. For example, the membrane 102 can have a tension per unit length of from 0.0 to 10.0 N/m (e.g., from 0.0 N/m to 8.0 N/m, from 0.0 N/m to 5.0 N/m, from 0.0 N/m to 3.0 N/m, from 0.0 N/m to 1.0 N/m, from 0.0 to 0.5 N/m, from 0.0 to 0.3 N/m, or from 0.03 N/m to 0.12 N/m). The tension can be measured using atomic force microscopy.

The one or more ripples can, for example, have an average length of 1 nm or more (e.g., 2 nm or more, 3 nm or more, 4 nm or more, 5 nm or more, 6 nm or more, 7 nm or more, 8 nm or more, 9 nm or more, 10 nm or more, 15 nm or more, 20 nm or more, 25 nm or more, 30 nm or more, 35 nm or more, 40 nm or more, 45 nm or more, 50 nm or more, 55 nm or more, 60 nm or more, 65 nm or more, 70 nm or more, 75 nm or more, or 80 nm or more). In some examples, the one or more ripples can have an average length of 100 nm or less (e.g., 95 nm or less, 90 nm or less, 85 nm or less, 80 nm or less, 75 nm or less, 70 nm or less, 65 nm or less, 60 nm or less, 55 nm or less, 50 nm or less, 45 nm or less, 40 nm or less, 35 nm or less, 30 nm or less, 25 nm or less, 20 nm or less, 15 nm or less, 10 nm or less, 9 nm or less, 8 nm or less, 7 nm or less, 6 nm or less, or 5 nm or less). The average length of the one or more ripples can range from any or the minimum values described above to any of the maximum values described above. For example, the one or more ripples can have an average length of from 1 nm to 100 nm (e.g., from 1 nm to 90 nm, from 1 nm to 80 nm, from 1 nm to 70 nm, from 1 nm to 60 nm, from 5 nm to 50 nm, from 10 nm to 40 nm, or from 20 nm to 30 nm). The length of the ripples can, for example, be measured using electron microscopy.

In some examples, the one or more ripples can have an average height of 0.1 nm or more (e.g., 0.11 nm or more, 0.12 nm or more, 0.13 nm or more, 0.14 nm or more, 0.15 nm or more, 0.20 nm or more, 0.25 nm or more, 0.30 nm or more, 0.35 nm or more, 0.40 nm or more, 0.45 nm or more, 0.50 nm or more, 0.60 nm or more, 0.70 nm or more, 0.80 nm or more, 0.90 nm or more, 1.0 nm or more, 1.1 nm or more, 1.2 nm or more, 1.3 nm or more, 1.4 nm or more, or 1.5 nm or more). In some examples, the one or more ripples can have an average height of 2.0 nm or less (e.g., 1.9 nm or less, 1.8 nm or less, 1.7 nm or less, 1.6 nm or less, 1.5 nm or less, 1.4 nm or less, 1.3 nm or less, 1.2 nm or less, 1.1 nm or less, 1.0 nm or less, 0.90 nm or less, 0.80 nm or less, 0.70 nm or less, 0.60 nm or less, 0.50 nm or less, 0.45 nm or less, 0.40 nm or less, 0.35 nm or less, 0.30 nm or less, 0.25 nm or less, or 0.20 nm or less). The average height of the one or more ripples can range from any of the minimum values described above to any of the maximum values described above. For example, the one or more ripples can have an average height of from 0.1 nm to 2.0 nm (e.g., 0.1 nm to 1.5 nm, from 0.1 nm to 1.0 nm, from 0.1 nm to 0.70 nm, from 0.20 nm to 0.60 nm, from 0.30 nm to 0.50 nm, or from 0.35 nm to 0.45 nm). The height of the ripples can, for example, be measured using electron microscopy.

The membrane 102 can, for example, be fixed at one or both ends to the substrate 104. In some examples, the membrane 102 is configured to vibrate through its central portion.

The substrate 104 can, for example, comprise copper, silicon, silicon carbide, sapphire, or a combination thereof. In some examples, the substrate 104 can comprise a grid comprising one or more apertures.

The following discussion is for a certain example where the membrane 102 comprises graphene and the substrate 104 comprises a copper grid, but the same concepts can apply to any of the membranes 102 and/or substrates 104 described herein.

Figure 2:
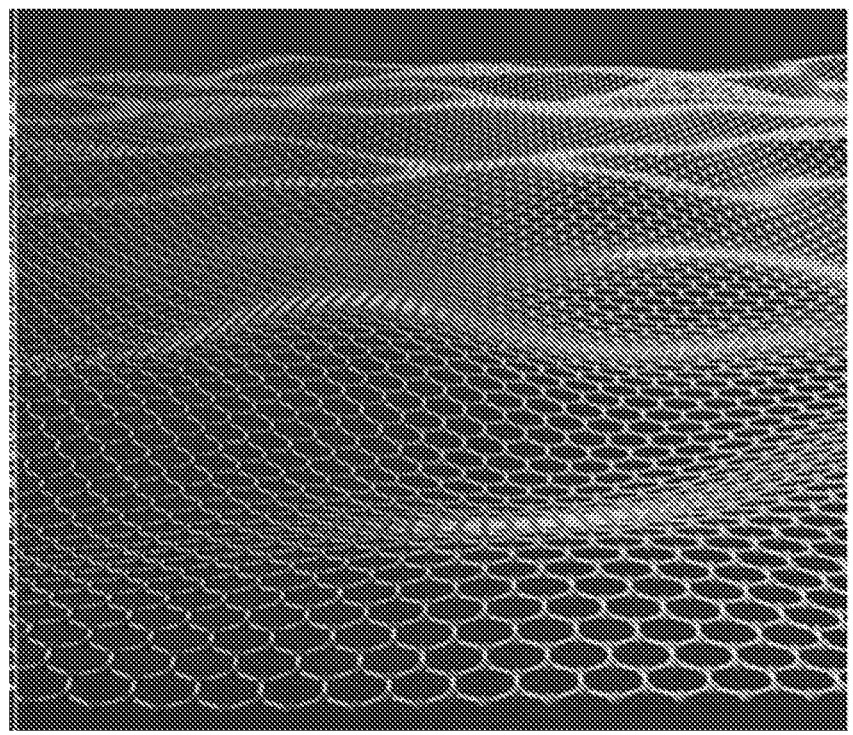
FIG. 2 is a schematic illustration of the naturally forming ripples in a graphene membrane.

In certain embodiments, the membrane 102 can comprise a single atomic plane of carbon from graphite as its active component. A sheet of graphene may be placed on top of a copper grid of one or more apertures. Each aperture, covered with graphene, can form an open frame geometry with freestanding graphene in between. When graphene is disposed on the copper grid, there is a strong van der Waals interaction (~0.1 J/m$^2$) between the edge of the graphene and the copper grid sidewall (FIG. 1). Depending on the amount of excess graphene, the length of contact shown as $z_o$ will naturally increase or decrease until the forces are balanced. This phenomenon is known as self-tensioning. The final tension can be ~0.1 N/m and the final geometry of the freestanding graphene can be composed of ripples (FIG. 2). These ripples can form naturally and the ripples can have a typical size distribution of 20-24 nm in length and 0.3 to 0.5 nm in height. In order for ripples to form, the graphene must be free to self-compress to the final self-tension.

The compression strain associated with the ripple geometry is the change in the length divided by the original length. The compression strain can, for example, be 0.01% or more (e.g., 0.02% or more, 0.03% or more, 0.04% or more, 0.05% or more, 0.06% or more, 0.07% or more, 0.08% or more, 0.09% or more, 0.1% or more, 0.2% or more, 0.3% or more, 0.4% or more, 0.5% or more, 0.6% or more, 0.7% or more, or 0.8% or more). In some examples, the compression strain can be 1% or less (e.g., 0.9% or less, 0.8% or less, 0.7% or less, 0.6% or less, 0.5% or less, 0.4% or less, 0.3% or less, 0.2% or less, 0.1% or less, 0.09% or less, 0.08% or less, 0.07% or less, 0.06% or less, 0.05% or less, or 0.04% or less). The compression strain can, for example, range from any of the minimum values described above to any of the maximum values described above. For example, the compression strain can range from 0.01% to 1% (e.g., from 0.01% to 0.1%, from 0.1% to 1%, from 0.01% to 0.05%, from 0.05% to 0.1%, from 0.1% to 0.5%, from 0.5% to 1%, or from 0.05% to 0.5%).

It is possible to apply a tensile load to the substrate 104 and graphene assembly, and alter the shape of the ripples, as the graphene is stretched. Altering the shape of the ripples alters the compressive strain and alters the rate at which the graphene will spontaneously invert its curvature. Alternatingly, by tuning the external load, the frequencies of vibration of the membrane 102 can be altered.

When held at room temperature (e.g. 300 K), the freestanding graphene can spontaneously vibrate, due to the thermal energy continuously flowing from the bar supports of the copper grid. At an atomic level, when the graphene membrane 102 is held at room temperature, each carbon atom has a kinetic energy (0.5 m v$^2$, where m is the mass of the carbon atom and v is its velocity) equal to $k_B T$ or about 25 meV. This is an abundant source of energy, since graphene has 4×10$^{15}$ atoms/cm$^2$. Electrical power calculations predict each ripple can produce 10 pW of power, equivalently 25,0000 W/m$^2$, which places it in a similar category to wind and solar energy production. Since the velocity is not zero, the atoms within the membrane 102 are in constant motion. Since the atoms are connected together in a network, the entire membrane 102 forms ripples and at times these ripples invert their curvature. Each ripple has thousands of atoms and when the curvature inverts itself, all the atoms move coherently together, in phase, and this energy can be harvested. This natural motion could be used as the active component of an energy harvesting device 100, or this natural motion could be used to drive the active component of a conventional vibration energy harvesting device 100.

In some examples, the membrane 102 can have one ripple. In some examples, the membrane 102 can comprise a plurality of ripples that can form a network of interacting ripples. A membrane 102 that measures 10 microns by 10 microns can, in some examples, have over 100,000 ripples. The motion of one ripple can affect the motion of other ripples nearby, thus providing a feedback mechanism which enhances the energy harvesting capability.

The energy harvesting devices 100 further comprise a component 106 electrically, magnetically, and/or mechanically coupled to the membrane 102 and/or the substrate 104, such that the component 106 is configured to harvest energy from the membrane 102.

In some examples, the substrate 104 is thermally conductive and the membrane 102 is in thermal contact with the substrate 104, wherein the thermal energy of the substrate 104 can be converted into a vibration of the membrane 102 such that the membrane 102 has a vibrational energy, and the component 106 is configured to convert the vibrational energy of the membrane 102 into electrical, magnetic, and/or mechanical energy, thereby harvesting energy from the membrane 102. In some examples, the thermal energy can comprise ambient thermal energy.

In some examples, the membrane 102 can have a vibrational energy and the component 106 is configured to convert the vibrational energy of the membrane 102 into electrical, magnetic, and/or mechanical energy, thereby harvesting energy from the membrane 102. In some examples, the vibrational energy comprises ambient vibrational energy.

The vibrational energy can, for example, comprise vibrations having a frequency of 0.1 milliHertz or more (e.g., 0.5 mHz or more, 1 mHz or more, 5 mHz or more, 10 mHz or more, 50 mHz or more, 100 mHz or more, 500 mHz or more, 1 Hz or more, 5 Hz or more, 10 Hz or more, 50 Hz or more, 100 Hz or more, 500 Hz or more, 1 kiloHertz (kHz) or more, 10 kHz or more, 50 kHz or more, 100 kHz or more, 500 kHz or more, 1 megaHertz (MHz) or more, 5 MHz or more, 10 MHz or more, 50 MHz or more, 100 MHz or more, 500 MHz or more, or 1 GigaHertz (GHz) or more). In some examples, the vibrational energy can comprise vibrations having a frequency of 10 GigaHertz (GHz) or less (e.g., 5 GHz or less, 1 GHz or less, 500 MHz or less, 100 MHz or less, 50 MHz or less, 10 MHz or less, 5 MHz or less, 1 MHz or less, 500 kHz or less, 100 kHz or less, 50 kHz or less, 10 kHz or less, 5 kHz or less, 1 kHz or less, 500 Hz or less, 100 Hz or less, 50 Hz or less, 10 Hz or less, 5 Hz or less, 1 Hz or less, 500 mHz or less, 100 mHz or less, 50 mHz or less, 10 mHz or less, or 5 mHz or less). The frequency of the vibrations of the vibrational energy can range from any of the minimum values described above to any of the maximum values described above. For example, the vibrational energy can comprise vibrations having a frequency of from 0.1 mHz to 10 GHz (e.g., from 0.1 mHz to 1 kHz, from 1 kHz to 10 GHz, from 0.1 mHz to 1 Hz, from 1 Hz to 1 kHz, from 1 kHz to 1 MHz, from 1 MHz to 10 GHz, or from 5 mHz to 1 GHz).

In some examples, the membrane 102 is capable of vibrating continuously since it can harness ambient energy at lower frequencies and independent of noise constraints. In turn, this ambient energy can be harnessed by the component 106 and converted into other forms of energy, including electricity.

Whereas conventional vibrational energy harvesting devices 100 have required a macroscopic external driving force to harvest vibrational energy (e.g., the vibrations in a moving car), in some example the energy harvesting devices 100 described herein can be driven via ambient conditions. For example, the energy harvesting devices 100 described herein can harvest energy in a quiet environment as well as a noisy environment.

In some examples, the energy harvesting device 100 can be configured such that each of the one or more ripples can produce a power of 1 picoWatt (pW) or more (e.g., 5 pW or more, 10 pW or more, 15 pW or more, 20 pW or more, 25 pW or more, 30 pW or more, 35 pW or more, 40 pW or more, 45 pW or more, 50 pW or more, 55 pW or more, 60 pW or more, 65 pW or more, 70 pW or more, 75 pW or more, 80 pW or more, 85 pW or more, or 90 pW or more). In some examples, the energy harvesting device 100 can be configured such that each of the one or more ripples can produce a power of 100 pW or less (e.g., 95 pW or less, 9095 pW or less, 8595 pW or less, 8095 pW or less, 7595 pW or less, 7095 pW or less, 6595 pW or less, 6095 pW or less, 5595 pW or less, 5095 pW or less, 4595 pW or less, 4095 pW or less, 3595 pW or less, 3095 pW or less, 2595 pW or less, 2095 pW or less, 1595 pW or less, or 1095 pW or less). The power produced by each of the one or more ripples can range from any of the minimum values described above to any of the maximum values described above. For example, the energy harvesting device 100 can be configured such that each of the one or more ripples can produce a power of from 1 pW to 100 pW (e.g., from 1 pW to 50 pW, from 50 pW to 100 pW, from 1 pW to 30 pW, from 20 pW to 40 pW, from 40 pW to 60 pW, from 60 pW to 80 pW, from 80 pW to 100 pW, from 10 pW to 90 pW, or from 20 pW to 80 pW).

In some examples, the energy harvesting device 100 can have a power density of 1 Watts per meters squared (W/m$^2$) or more (e.g., 2 W/m$^2$ or more; 3 W/m$^2$ or more; 4 W/m$^2$ or more; 5 W/m$^2$ or more; 10 W/m$^2$ or more; 50 W/m$^2$ or more; 100 W/m$^2$ or more; 500 W/m$^2$ or more; 1,000 W/m$^2$ or more; 5,000 W/m$^2$ or more; 10,000 W/m$^2$ or more; or 50,000 W/m$^2$ or more). In some examples, the energy harvesting device 100 can have a power density of 100,000 W/m$^2$ or less (e.g., 90,000 W/m$^2$ or less; 80,000 W/m$^2$ or less; 70,000 W/m$^2$ or less; 60,000 W/m$^2$ or less; 50,000 W/m$^2$ or less; 10,000 W/m$^2$ or less; 5,000 W/m$^2$ or less; 1,000 W/m$^2$ or less; 500 W/m$^2$ or less; 100 W/m$^2$ or less; 50 W/m$^2$ or less; 10 W/m$^2$ or less; or 5 W/m$^2$ or less). The power density of the energy harvesting device 100 can range from any of the minimum values described above to any of the maximum values described above. For example, the energy harvesting device 100 can have a power density of from 1 W/m$^2$ to 100,000 W/m$^2$ (e.g., from 1 W/m$^2$ to 1,000 W/m$^2$; from 1,000 W/m$^2$ to 100,000 W/m$^2$; from 1 W/m$^2$ to 100 W/m$^2$; from 100 W/m$^2$ to 1,000 W/m$^2$; from 1,000 W/m$^2$ to 10,000 W/m$^2$; from 10,000 W/m$^2$ to 100,000 W/m$^2$; from 10 W/m$^2$ to 50,000 W/m$^2$; or from 100 W/m$^2$ to 10,000 W/m$^2$).

Figure 3:
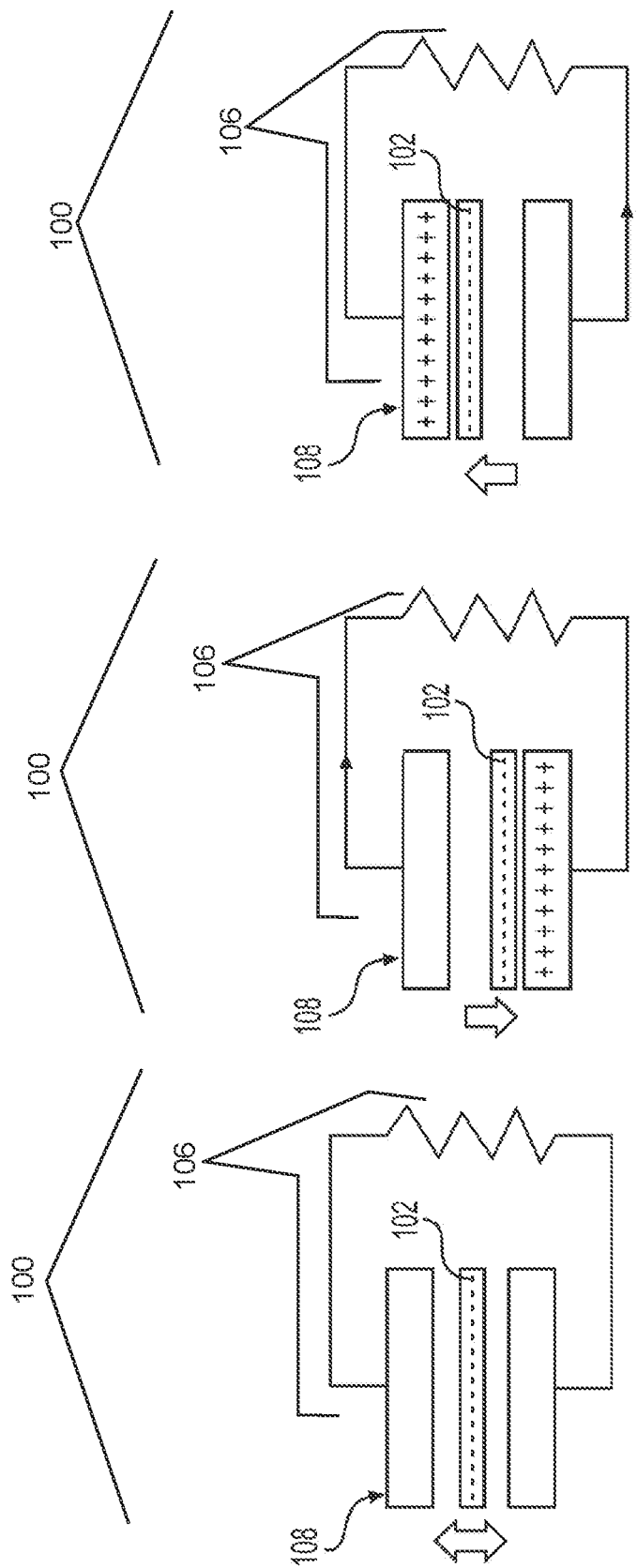
FIG. 3 is a schematic diagram of an energy harvesting device.

Referring now to FIG. 3, in some examples, the membrane 102 can have an electrical charge and the component 106 comprises a capacitor 108 disposed around and electrically coupled to the membrane 102, wherein the capacitor 108 is configured to convert the vibrational energy of the charged membrane 102 into an alternating electrical current, thereby harvesting energy from the membrane 102. For example, the movement of the charged membrane 102 (center), induces current in the nearby capacitor plates (upper and lower plates) 108. This system is an electret-based electrostatic converter, based on a variable-gap capacitor design. The fixed charge on the membrane 102 acts as a fixed voltage source and as the membrane 102 moves the capacitance changes with time, since the distance changes with time. The output power is proportional to the voltage squared times the change in capacitance divided by the change in time for one cycle. Electrets enable a simple mechanical to electrical energy conversion.

Figure 4:
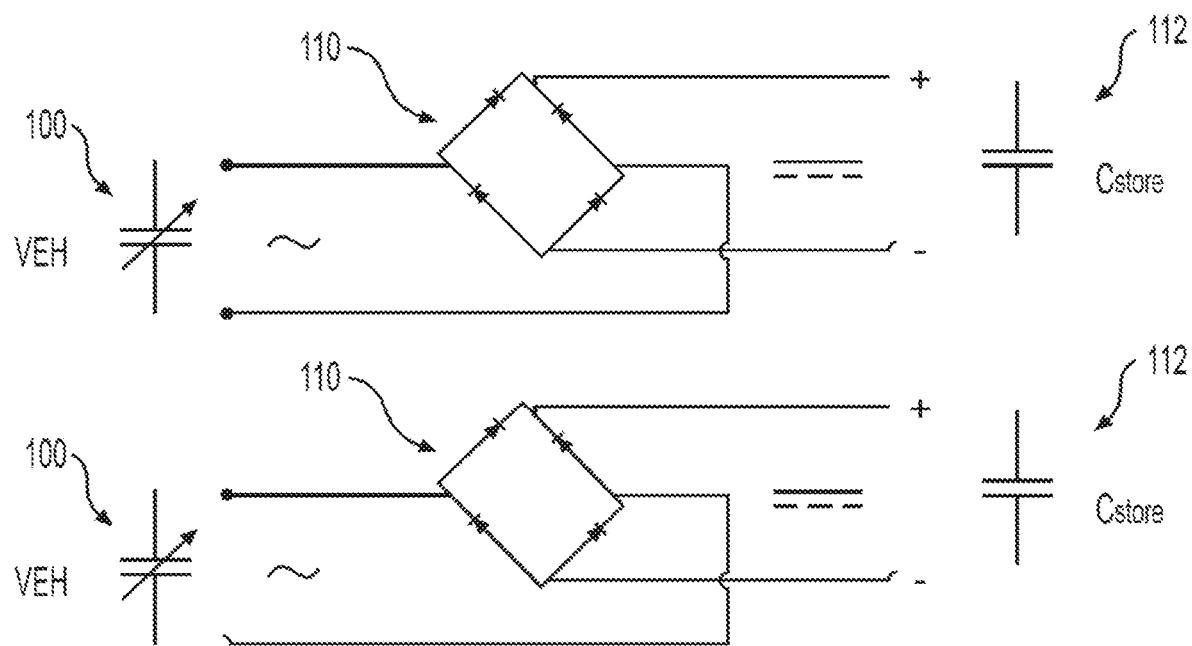
FIG. 4 is a schematic diagram of the alternating current produced by the energy harvesting shown in FIG. 3 being converted to direct current and stored in a capacitor.

Referring now to FIG. 4, in some examples, the device 100 can further comprise a diode bridge circuit 110 to convert the alternating electrical current into a direct electrical current. The device 100 can, for example, further comprise a capacitor 112 electrically coupled to the diode bridge 110, such that the direct current can charge the capacitor 112, thereby storing the charge generated by the vibrational energy of the charged membrane 102. Once charged, the capacitor 112 can, for example, be used to power an electronic device, such as for a single cycle of a wireless sensor application.

Figure 5:
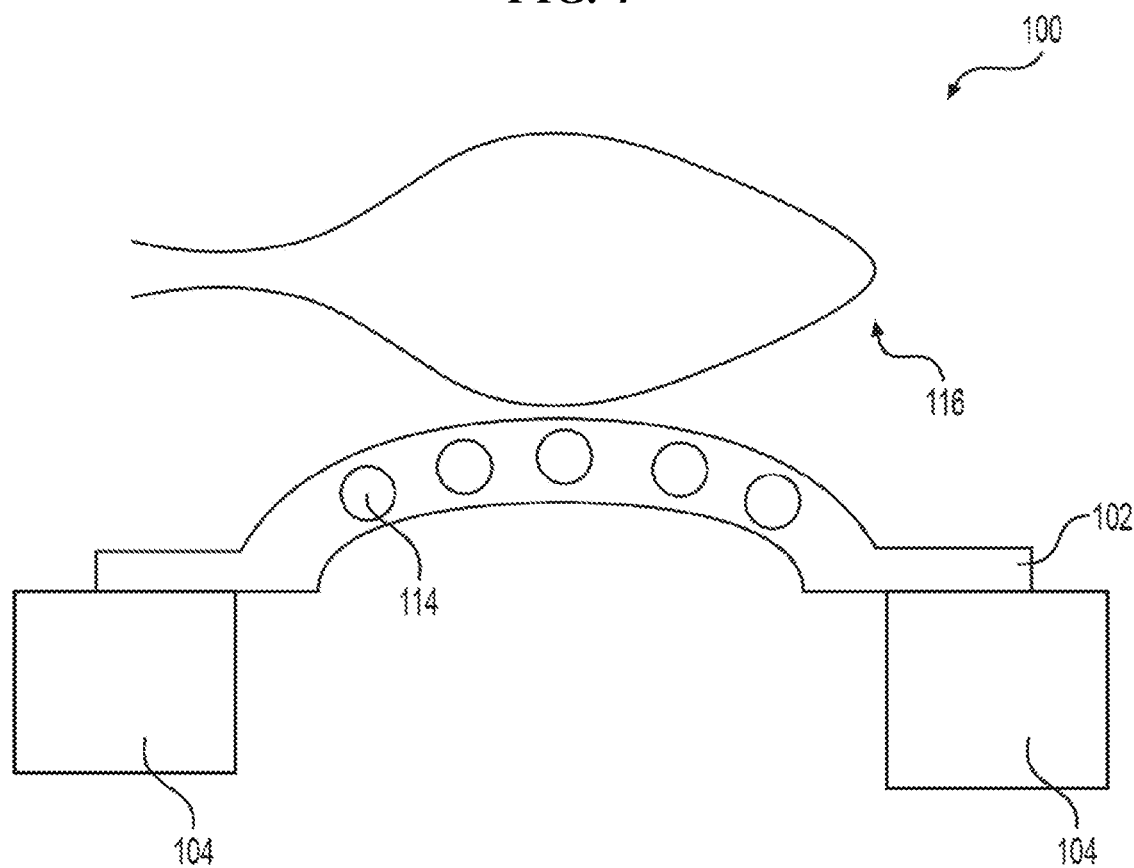
FIG. 5 is a schematic diagram of an energy harvesting device.

In some examples, the energy harvesting device 100 can comprise an electromagnetic induction device. Referring now to FIG. 5, in some examples the membrane 102 can further comprise a plurality of magnetic particles 114. The plurality of magnetic particles 114 can, for example, comprise iron, cobalt, niobium, manganese, nickel, or a combination thereof. In some examples, the plurality of magnetic particles 114 can comprise iron oxide, cobalt oxide, or a combination thereof.

The plurality of magnetic particles 114 can have an average particle size. "Average particle size" and "mean particle size" are used interchangeably herein, and generally refer to the statistical mean particle size of the particles in a population of particles. For example, the average particle size for a plurality of particles with a substantially spherical shape can comprise the average diameter of the plurality of particles. For an anisotropic particle, the average particle size can refer to, for example, the average maximum dimension of the particle (e.g., the length of a rod shaped particle, the diagonal of a cube shape particle, the bisector of a triangular shaped particle, etc.). Mean particle size can be measured using methods known in the art, such as evaluation by scanning electron microscopy and/or transmission electron microscopy.

In some examples, the plurality of magnetic particles 114 can be substantially monodisperse. "Monodisperse" and "homogeneous size distribution," as used herein, and generally describe a population of particles where all of the particles are the same or nearly the same size. As used herein, a monodisperse distribution refers to particle distributions in which 80% of the distribution (e.g., 85% of the distribution, 90% of the distribution, or 95% of the distribution) lies within 25% of the median particle size (e.g., within 20% of the median particle size, within 15% of the median particle size, within 10% of the median particle size, or within 5% of the median particle size).

The plurality of magnetic particles can comprise particles of any shape (e.g., a sphere, a rod, a quadrilateral, an ellipse, a triangle, a polygon, etc.). In some examples, the plurality of magnetic particles 114 can have an isotropic shape. In some examples, the plurality of magnetic particles 114 can have an anisotropic shape.

The plurality of magnetic particles 114 can, for example, have an average particle size of 0.5 nm or more (e.g., 0.6 nm or more, 0.7 nm or more, 0.8 nm or more, 0.9 nm or more, 1.0 nm or more, 1.1 nm or more, 1.2 nm or more, 1.3 nm or more, 1.4 nm or more, 1.5 nm or more, 1.6 nm or more, 1.7 nm or more, 1.8 nm or more, 1.9 nm or more, 2.0 nm or more, 2.5 nm or more, 3.0 nm or more, 3.5 nm or more, 4.0 nm or more, 4.5 nm or more, 5.0 nm or more, 5.5 nm or more, 6.0 nm or more, 6.5 nm or more, 7.0 nm or more, 7.5 nm or more, or 8.0 nm or more). In some examples, the plurality of magnetic particles 114 can have an average particle size of 10.0 nm or less (e.g., 9.5 nm or less, 9.0 nm or less, 8.5 nm or less, 8.0 nm or less, 7.5 nm or less, 7.0 nm or less, 6.5 nm or less, 6.0 nm or less, 5.5 nm or less, 5.0 nm or less, 4.5 nm or less, 4.0 nm or less, 3.5 nm or less, 3.0 nm or less, 2.5 nm or less, 2.0 nm or less, 1.9 nm or less, 1.8 nm or less, 1.7 nm or less, 1.6 nm or less, 1.5 nm or less, 1.4 nm or less, 1.3 nm or less, 1.2 nm or less, 1.1 nm or less, or 1.0 nm or less). The average particle size of the plurality of magnetic particles 114 can range from any of the minimum values described above to any of the maximum values described above. For example, the plurality of magnetic particles 114 can have an average particle size of from 0.5 nm to 10.0 nm (e.g., from 0.5 nm to 9.0 nm, from 0.5 nm to 8.0 nm, from 0.5 nm to 7.0 nm, from 0.5 nm to 6.0 nm, from 0.5 nm to 5.0 nm, from 0.5 nm to 4.0 nm, from 0.5 nm to 3.0 nm, 0.5 nm to 2.5 nm, or from 1.0 nm to 2.0 nm). The average particle size of the plurality of magnetic particles 114 can, for example, be determined using high-resolution transmission electron microscopy.

In some examples, the component 106 can comprise an electrode loop 116 magnetically coupled to the membrane 102, wherein the device 100 is configured to convert the vibrational energy of the membrane 102 into a time-varying magnetic field which induces an electrical current in the electrode loop 116 via Faraday's Law, thereby converting the vibrational energy of the membrane 102 into an electrical current and harvesting energy from the membrane 102. The device can 100, for example, further comprise a capacitor electrically coupled to the electrode loop 116, such that the energy harvested by the device 100 can be stored in the capacitor.

Figure 6:
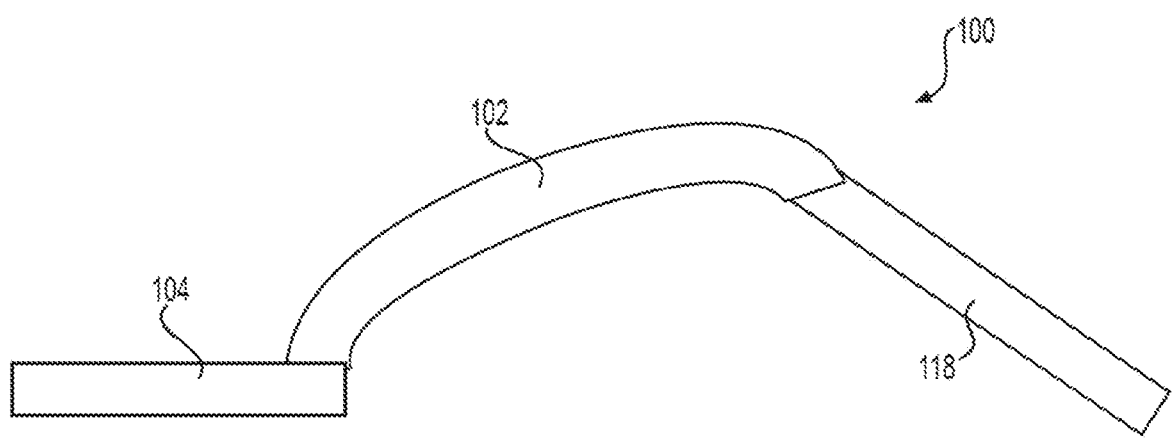
FIG. 6 is a schematic diagram of an energy harvesting device.

Referring now to FIG. 6, in some examples, the component 106 can comprise a piezoelectric cantilever 118 and the membrane 102 has an edge that is mechanically coupled to the piezoelectric cantilever 118, wherein the piezoelectric cantilever 118 is configured to convert the vibrational energy of the membrane 102 into electrical energy, thereby harvesting energy from the membrane 102. The device 100 can, for example, further comprises a capacitor electrically coupled to the piezoelectric cantilever 118, such that the energy harvested by the device 100 can be stored in the capacitor. In some examples, the piezoelectric cantilever 118 can comprise an element of a conventional vibration energy harvesting device 100, such that the energy harvesting devices 100 described herein can be used to power a conventional vibration energy harvesting device 100 via an interconnected piezoelectric cantilever 118.

Figure 7:
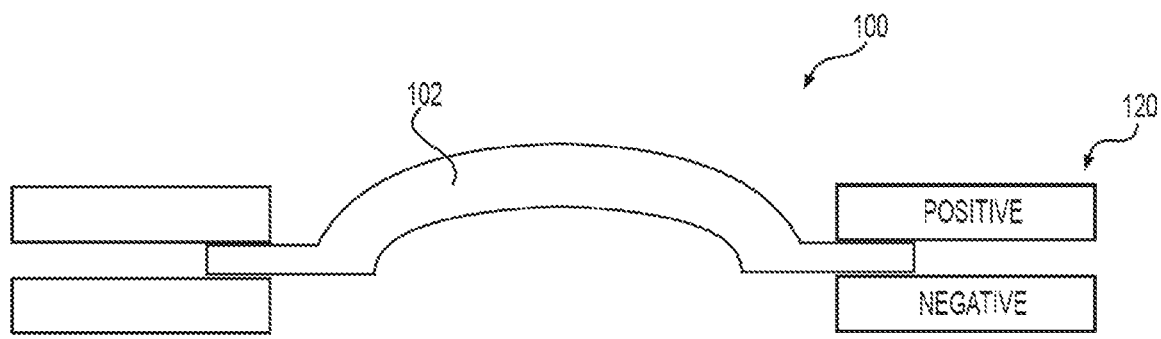
FIG. 7 is a schematic diagram of an energy harvesting device.

Referring now to FIG. 7, in some examples, the membrane 102 can be piezoelectric and the component 106 comprises a voltage readout 120 mechanically and electrically coupled to the membrane 102, wherein the piezoelectric membrane 102 is configured to convert vibrational energy into electrical energy, which can be harvested by the voltage readout 120. In certain examples, the vibration of the piezoelectric membrane 102 can produce an alternative voltage as the piezoelectric membrane 102 vibrates and inverts its curvature. The device 100 can, for example, further comprise a capacitor electrically coupled to the voltage readout 120, such that the energy harvested by the device 100 can be stored in the capacitor.

Figure 8A:
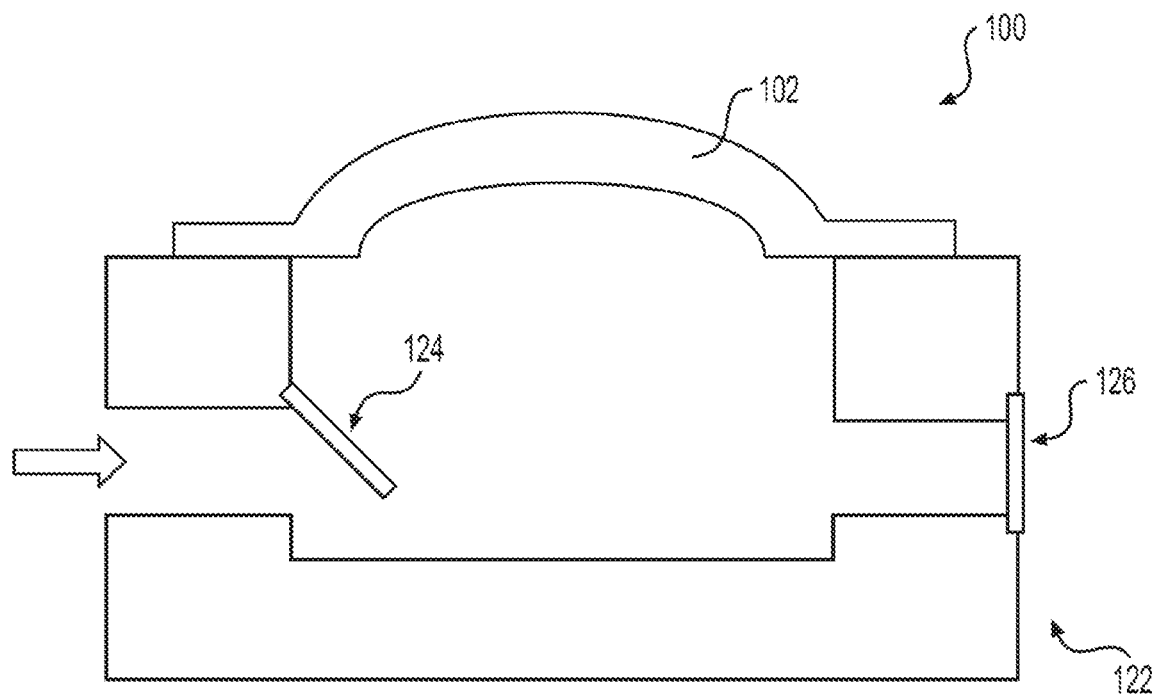
FIG. 8A is a schematic diagram of an energy harvesting device.
Figure 8B:
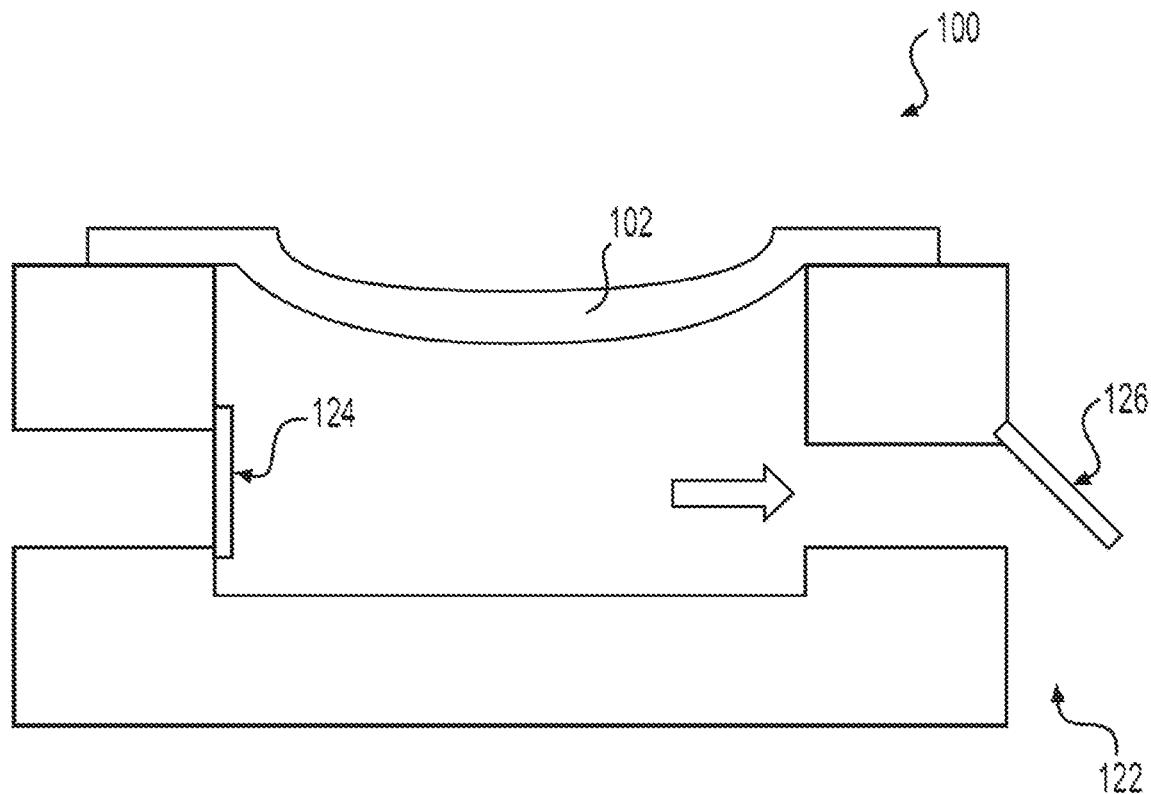
FIG. 8B is a schematic diagram of an energy harvesting device.

Referring now to FIG. 8A and FIG. 8B, in some examples, the component 106 can comprise a box pump 122 mechanically coupled to the membrane 102 and/or the substrate 104, wherein the box pump 122 comprises a first one-way fluid flow valve 124 governing a fluid entrance and a second one-way fluid flow valve 126 governing a fluid exit, and wherein the box pump 122 is configured to convert vibrational energy of the membrane 102 into flow of a fluid through the box pump 122 via the first one-way fluid flow valve 124 and/or the second one-way fluid flow valve 126, thereby converting the vibrational energy of the membrane 102 to fluid flow, and harvesting energy from the membrane 102.

Figure 9A:
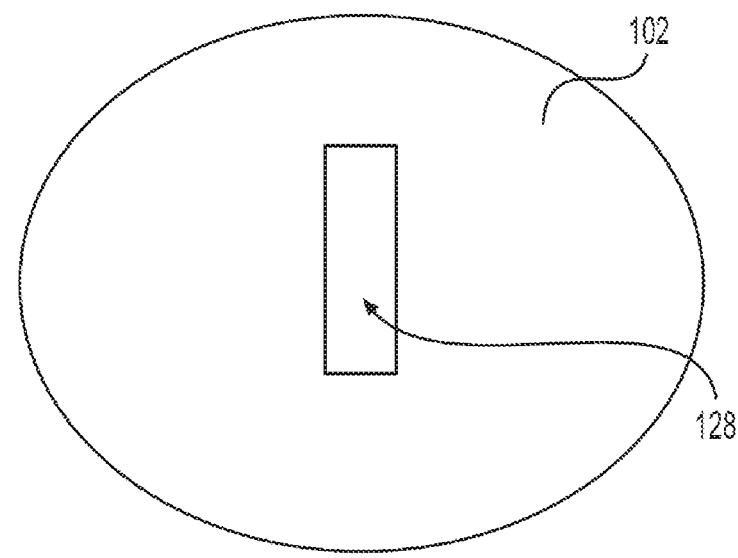
FIG. 9A is a schematic diagram of an energy harvesting device.
Figure 9B:
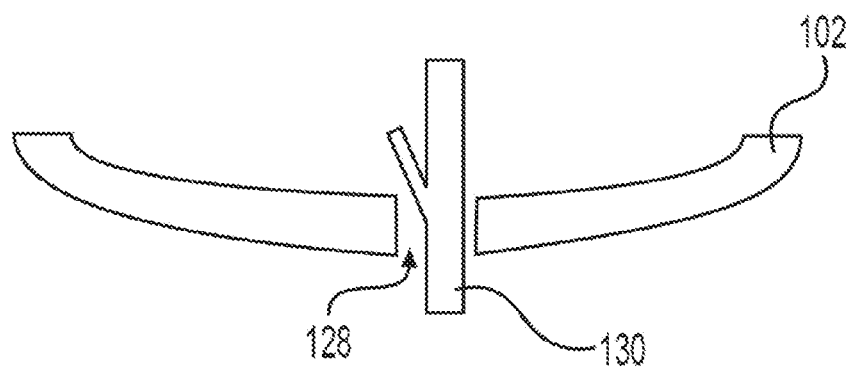
FIG. 9B is a schematic diagram of an energy harvesting device.
Figure 9C:
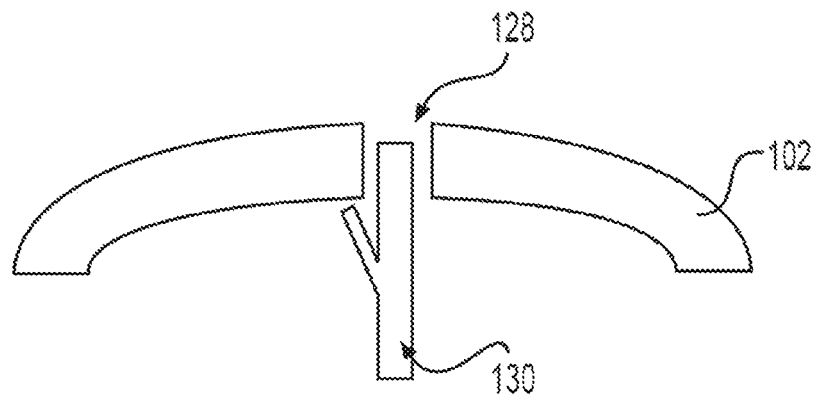
FIG. 9C is a schematic diagram of an energy harvesting device.

In some examples, engineering specific channel geometries in a particular membrane 102, along with complementary ratchet-style components, can create small artificial Lévy motors. In certain examples, the motion of objects through the membrane 102 can be controlled. Referring now to FIG. 9A, FIG. 9B, and FIG. 9C, in some examples, the membrane 102 can further comprise a channel 128 that traverses the membrane 102. The component 106 can, for example, comprise a ratchet-style transporter 130 mechanically coupled to the membrane 102, wherein the ratchet-style transporter 130 is configured convert the vibrational energy of the membrane 102 into translation of the ratchet-style transporter 130, such that the ratchet-style transporter 130 can be transported from one side of the membrane 102 to the other via the channel 128 upon vibration of the membrane 102, thereby converting the vibrational energy of the membrane 102 into translation of the ratchet-style transporter 130, and harvesting energy from the membrane 102. For example, as the membrane 102 inverts its curvature, objects with engineered geometries (e.g., a ratchet-style transporter 130) can be pulled through the membrane 102 and not allowed to return to the other side. In this way, this device 100 can be used to separate or purify a sample.

Also disclosed herein are sensors 140, the sensors 140 further comprising a component 142 electrically, magnetically, and/or mechanically coupled to the membrane 102 and/or the substrate 104, such that the component 142 is configured to detect a signal from the membrane 102.

In some examples, the substrate 104 is thermally conductive and the membrane 102 is in thermal contact with the substrate 104, wherein the substrate 104 is configured to convert thermal energy into vibration of the membrane 102 such that the membrane 102 has a vibrational energy, and the component 142 is configured detect a signal produced by the vibrational energy of the membrane 102. The thermal energy can, for example, comprise ambient thermal energy.

In some examples, the membrane 102 has a vibrational energy and the component 142 is configured to detect a signal produced by the vibrational energy of the membrane 102. The vibrational energy can, for example, comprise ambient vibrational energy.

The vibrational energy can, for example, comprise vibrations having a frequency of 0.1 milliHertz or more (e.g., 0.5 mHz or more, 1 mHz or more, 5 mHz or more, 10 mHz or more, 50 mHz or more, 100 mHz or more, 500 mHz or more, 1 Hz or more, 5 Hz or more, 10 Hz or more, 50 Hz or more, 100 Hz or more, 500 Hz or more, 1 kiloHertz (kHz) or more, 10 kHz or more, 50 kHz or more, 100 kHz or more, 500 kHz or more, 1 megaHertz (MHz) or more, 5 MHz or more, 10 MHz or more, 50 MHz or more, 100 MHz or more, 500 MHz or more, or 1 GigaHertz (GHz) or more). In some examples, the vibrational energy can comprise vibrations having a frequency of 10 GigaHertz (GHz) or less (e.g., 5 GHz or less, 1 GHz or less, 500 MHz or less, 100 MHz or less, 50 MHz or less, 10 MHz or less, 5 MHz or less, 1 MHz or less, 500 kHz or less, 100 kHz or less, 50 kHz or less, 10 kHz or less, 5 kHz or less, 1 kHz or less, 500 Hz or less, 100 Hz or less, 50 Hz or less, 10 Hz or less, 5 Hz or less, 1 Hz or less, 500 mHz or less, 100 mHz or less, 50 mHz or less, 10 mHz or less, or 5 mHz or less). The frequency of the vibrations of the vibrational energy can range from any of the minimum values described above to any of the maximum values described above. For example, the vibrational energy can comprise vibrations having a frequency of from 0.1 mHz to 10 GHz (e.g., from 0.1 mHz to 1 kHz, from 1 kHz to 10 GHz, from 0.1 mHz to 1 Hz, from 1 Hz to 1 kHz, from 1 kHz to 1 MHz, from 1 MHz to 10 GHz, or from 5 mHz to 1 GHz).

For example, in certain implementations of the sensor 140, a component 142 can be operatively connected with the membrane 102, wherein the membrane 102 will have a predetermined sensitivity operable to harness relatively low frequency vibrations. Accordingly, the component 142 can be configured to detect the buckling frequency of the membrane 102 and when a predetermined change in the frequency of the membrane 102 is detected by the component 142, for example based on the presence of an added mass, an output as to the detection of the mass will be determined and transmitted, due to the sensitivity of the membrane 102 of the device.

Figure 10:
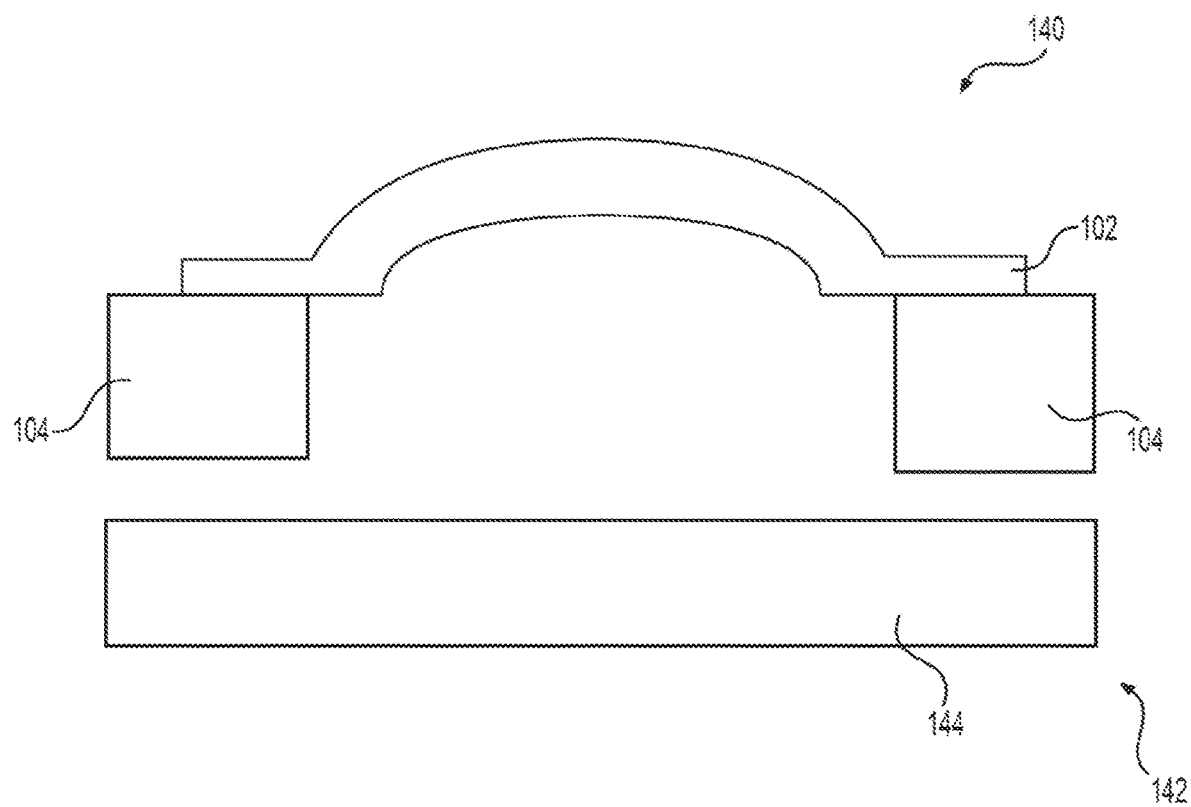
FIG. 10 is a schematic diagram of a sensor.

Referring now to FIG. 10, the component 142 can comprise an electrode 144 electrically coupled to the membrane 102 and/or substrate 104. The electrode can 144, for example, the located adjacent to the membrane 102 and electrically coupled to the membrane 102 and/or substrate 104. The electrode 144 can, for example, comprise be a single electrode and can comprise a metal pickup electrode. In some examples, the sensor 140 can be aligned such that the electrode 144 is positioned below the membrane 102. For example, the electrode 144 can be configured to continuously monitor the voltage pickup frequency, such that the electrode can detect any change in the voltage pickup frequency and/or the magnitude of the voltage pickup.

In some examples, the electrode is configured to detect a frequency of the vibrational energy of the membrane 102, such that the sensor is configured to detect a change in mass of the membrane 102 based on a change in the frequency of vibration of the membrane 102. When extra mass is added to the membrane 102, it alters the natural frequency of the membrane 102. Calibration experiments would allow the change in mass to be quantified based on the change in frequency.

In some examples, the electrode is configured to detect a magnitude of a voltage signal from the membrane 102 such that the sensor is configured to detect a change in charge of the membrane 102 based on a change in the change in the magnitude of the detected voltage signal.

Methods of Making

Also disclosed herein are methods of making the energy harvesting devices and sensors described herein. For example, the methods of making the energy harvesting devices and/or sensors described herein can comprise: compressing a sheet of the two-dimensional material to form the membrane; disposing the membrane on the substrate; and electrically, magnetically, and/or mechanically coupling the component to the membrane and/or the substrate.

Figure 11:
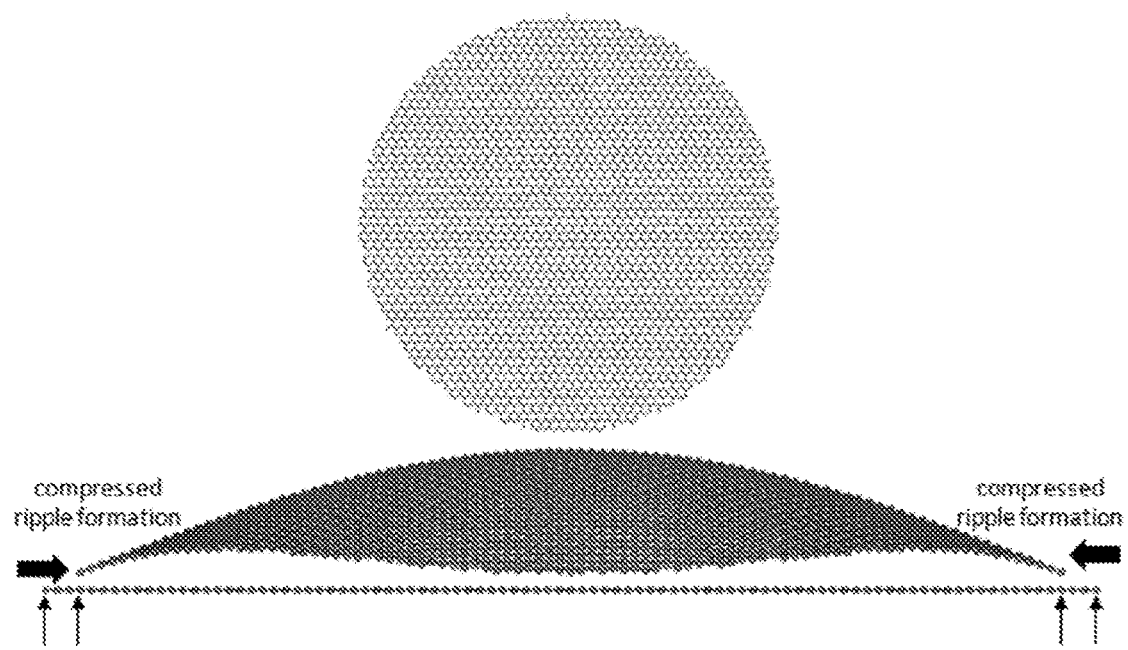
FIG. 11 depicts the top view and side view implementation of a two-dimensional material membrane showing formation of one ripple.
Figure 12:
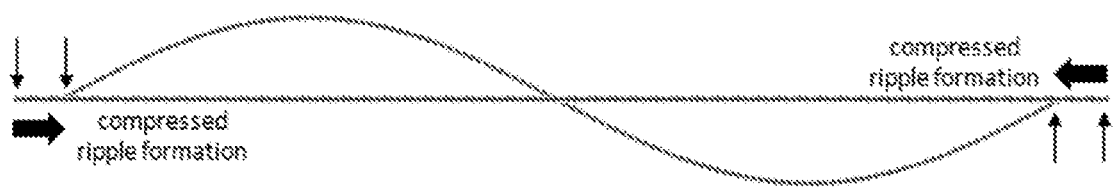
FIG. 12 depicts the side view in cross-section of an implementation of a membrane showing formation of two ripples with a naturally occurring compression force at two separate end points on the membrane.

Compressing the sheet of the two-dimensional material can, for example, comprise applying a lateral compression force across the sheet, as shown schematically in FIG. 11 and FIG. 12. The lateral compression force can, for example, have a magnitude of 1 nanoNewton (nN) or more (e.g., 5 nN or more, 10 nN or more, 15 nN or more, 20 nN or more, 25 nN or more, 30 nN or more, 35 nN or more, 40 nN or more, 45 nN or more, 50 nN or more, 55 nN or more, 60 nN or more, 65 nN or more, 70 nN or more, 75 nN or more, 80 nN or more, 85 nN or more, or 90 nN or more). In some examples, the lateral compression force can be 100 nN or less (e.g., 95 nN or less, 90 nN or less, 85 nN or less, 80 nN or less, 75 nN or less, 70 nN or less, 65 nN or less, 60 nN or less, 55 nN or less, 50 nN or less, 45 nN or less, 40 nN or less, 35 nN or less, 30 nN or less, 25 nN or less, 20 nN or less, 15 nN or less, or 10 nN or less). The lateral compression force can range from any of the minimum values described above to any of the maximum values described above. For example, the lateral compression force can be from 1 nN to 100 nN (e.g., from 1 nN to 50 nN, from 50 nN to 500 nN, from 1 nN to 20 nN, from 20 nN to 40 nN, from 40 nN to 60 nN, from 60 nN to 80 nN, from 80 nN to 100 nN, from 5 nN to 95 nN, from 10 nN to 90 nN, or from 20 nN to 80 nN).

Figure 13:
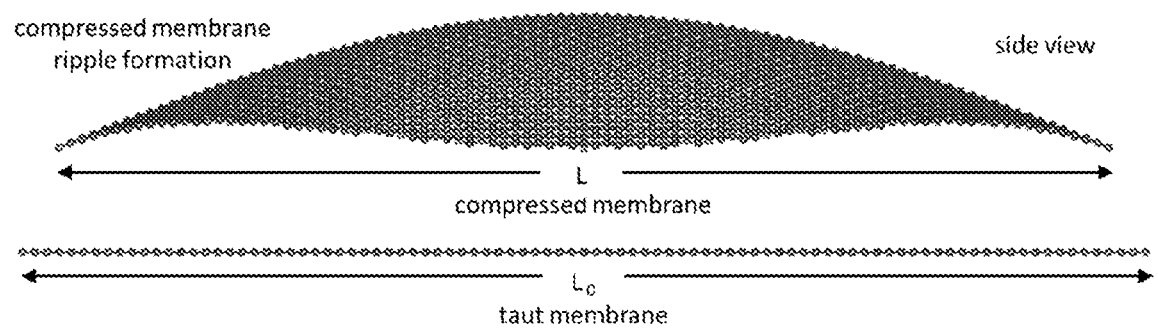
FIG. 13 is a schematic diagram of compressing a sheet of two-dimensional material.

In some examples, the sheet of two-dimensional material has an original length and the compressed sheet of the two-dimensional material has a compressed length, for example as shown schematically in FIG. 13, wherein the compressed length is shorter than the original length by an amount of from 0.01% to 1%.

In some examples, the buckling range of the membrane can be 0.2 nm or more (e.g., 0.3 nm or more, 0.4 nm or more, 0.5 nm or more, 0.6 nm or more, 0.7 nm or more, 0.8 nm or more, 0.9 nm or more, 1.0 nm or more, 1.5 nm or more, 2.0 nm or more, 2.5 nm or more, or 3.0 nm or more). In some examples, the buckling range of the membrane can be 4.0 nm or less (e.g., 3.5 nm or less, 3.0 nm or less, 2.5 nm or less, 2.0 nm or less, 1.5 nm or less, 1.0 nm or less, 0.9 nm or less, 0.8 nm or less, 0.7 nm or less, 0.6 nm or less, or 0.5 nm or less). The buckling range can range from any of the minimum values described above to any of the maximum values described above. For example, the buckling range can be from 0.2 nm to 4.0 nm (e.g., from 0.2 nm to 2.0 nm, from 2.0 nm to 4.0 nm, from 0.2 nm to 1.0 nm, from 1.0 nm to 2.0 nm, from 2.0 nm to 3.0 nm, from 3.0 nm to 4.0 nm, or from 0.5 nm to 3.5 nm). The buckling range is generally equal to two times the average height of the one or more ripples. Mechanical buckling is inversion of the curvature of a ripple.

Forming the membrane into a pre-buckling state by compressing the two-dimensional sheet as disclosed herein can slow the process of buckling so that the membrane is capable of interacting and harnessing lower frequency vibrations, such as those associated with ambient conditions. If the membrane is disposed onto the substrate using a strain-free method, then the membrane can self-compress into a pre-buckling state. For example, with graphene on copper, the copper can be etched off suing an iron chloride liquid solution. The graphene can remain floating on the surface of the solution alter the copper is removed. Next, the graphene can be lifted out of the solution and disposed on a substrate comprising a grid. Compressing or expanding the grid can alter the size of the ripples and alter the natural frequency of the spontaneous curvature inversion.

Methods of Use

Also disclosed herein are methods of use of the energy harvesting devices and/or sensors described herein. For example, also disclosed herein are methods of harvesting energy using the energy harvesting devices described herein.

The energy harvesting devices described herein can, for example, be incorporated into a variety of systems, devices, and methods for extracting energy, including discharge sensors, force and mass sensors, and self-powered devices. Systems, devices, and methods in accordance with certain example embodiments that incorporate one or more energy harvesting devices as described herein can utilize dynamics of atomic-scale fluctuations of a freestanding two-dimensional membrane. The membrane can incorporate random out-of-plane motion which exhibits anomalous dynamics and long-tail equilibrium distributions of dynamical variables symptomatic of Lévy walks. The fluctuating membrane can be controlled, for example, using scanning tunneling microscopy (STM).

It should be appreciated that any of the components or modules referred to with regards to energy harvesting devices, and associated systems and methods, of the disclosed technology, may be integrally or separately formed with one another. Further, redundant functions or structures of the components or modules may be implemented. Any of the herein described features and their components discussed herein may take on all shapes to provide and meet the environmental, structural demands, and operational requirements. Moreover, locations and alignments of the various components may vary as desired or required.

What has been described above includes examples of one or more embodiments. It is, of course, not possible to describe every conceivable combination of components or methodologies for purposes of describing the aforementioned embodiments, but one of ordinary skill in the art may recognize that many further combinations and permutations of various embodiments are possible. Accordingly, the described embodiments are intended to embrace all such alterations, modifications and variations that fall within the spirit and scope of the disclosure and claims here appended and to be filed in non-provisional patent applications.

EXAMPLES

The following examples are set forth below to illustrate the methods and results according to the disclosed subject matter. These examples are not intended to be inclusive of all aspects of the subject matter disclosed herein, but rather to illustrate representative methods and results. These examples are not intended to exclude equivalents and variations of the present invention which are apparent to one skilled in the art.

Efforts have been made to ensure accuracy with respect to numbers (e.g., amounts, temperature, etc.) but some errors and deviations should be accounted for. Unless indicated otherwise, parts are parts by weight, temperature is in ° C. or is at ambient temperature, and pressure is at or near atmospheric. There are numerous variations and combinations of reaction conditions, e.g., component concentrations, temperatures, pressures and other reaction ranges and conditions that can be used to optimize the product purity and yield obtained from the described process. Only reasonable and routine experimentation will be required to optimize such process conditions.

Example 1

Subnanometer, high-bandwidth measurements of the out-of-plane (vertical) motion of atoms in freestanding graphene using scanning tunneling microscopy are described herein. By tracking the vertical position over a long time period, a 1000-fold increase in the ability to measure space-time dynamics of atomically thin membranes was achieved over the current state-of-the-art imaging technologies. The vertical motion of a graphene membrane was observed to exhibit rare long-scale excursions characterized by both anomalous mean-squared displacements and Cauchy-Lorentz power law jump distributions.

Stochastic processes are ubiquitous in nature. Studies of such stochastic processes have played a pivotal role in the development of modern physics and provided the first evidence of the atomic nature of matter. Langevin initiated a truly dynamical theory for Brownian motion by conceiving a stochastic differential equation of motion for the particle. This model, often called the Ornstein-Uhlenbeck model, predicts mean-squared displacement, $MSD(\tau) \propto \tau$, a velocity autocorrelation function (VCAF) exponentially decaying in time, and a Maxwell-Boltzmann equilibrium velocity distribution (Li T et al. *Science* 2010, 328, 1673). Recent advances in measurement precision and resolution have extended the framework of Brownian motion to unprecedented space-time scales and to a wider variety of systems, including atomic diffusion in optical lattices and spin diffusion in liquids (Stapf S et al. *Phys. Rev. Lett.* 1995, 75, 2855; Katori H et al. *Phys. Rev. Lett.* 1997, 79, 2221). Studies of such systems are providing insights into the mechanisms and interactions responsible for stochasticity. For example, the particle may execute classical Brownian motion in a small neighborhood, but then move suddenly over a large distance to a new neighborhood, where it resumes classical movement. This is the crux of Lévy walks with finite speeds and finite waiting times, in which the higher-velocity segments and jump lengths of the movement yield long-tailed power law distributions (Shlesinger M F et al. *Nature (London)* 1993, 363, 31; Metzler R and Klafter *J. Phys. Rep.* 2000, 339, 1). It has been hypothesized that Lévy walks are present in a diverse set of systems, ranging from economics, biomedical signals, climate dynamics, and even animal foraging. It is now believed that an optimized search algorithm, even within information foraging theory, should utilize a Lévy stable distribution with infinite variance (Viswanathan G M et al. *Nature (London)* 1999, 401, 911).

Membrane fluctuations, characterized by movement perpendicular to the membrane's surface, also fall under the purview of Brownian motion. Biomembranes, in which thermal fluctuations aid the transport of chemicals through channels to the interior of a cell (Kosztin I and Schulten K. *Phys. Rev. Lett.* 2004, 93, 238102), have been studied experimentally using nuclear magnetic resonance spectroscopy and optical microscopy (Bocian D F and Chan S I. *Annu. Rev. Phys. Chem.* 1978, 29, 307; Pecreaux J et al. *Eur. Phys. J. E* 2004, 13, 277). Moreover, modern theories of membrane structure and dynamics, which include elasticity as well as stochastic effects via the Langevin equation, predict a Maxwell-Boltzmann distribution for the local fluctuations of the membrane (Naji A et al. *Phys. Rev. Lett.* 2009, 102, 138102; Reister-Gottfried E et al. *Phys. Rev. E* 2010, 81, 031903).

Freestanding graphene can be a crystalline membrane that can be probed without degradation on an atomic scale with scanning tunneling microscopy (STM) in an ultrahigh vacuum (UHV) environment. Using this approach, it was shown that the ripples in a graphene membrane can be described using an Ising model by mapping curved up (down) ripples into up (down) states of an Ising spin (Schoelz J K et al. *Phys. Rev. B* 2015, 91, 045413). A component missing from these studies is a measurement of the dynamic fluctuations. Herein, scanning tunneling microscopy was used to track the movement of a single carbon atom-sized region of a fluctuating graphene membrane with subnanometer resolution. The membrane executes Brownian motion with rare large height excursions indicative of Lévy walks. In addition, the membrane velocity obeys a long-tail Cauchy-Lorentz power law distribution, rather than a Maxwell-Boltzmann distribution.

Figure 17:
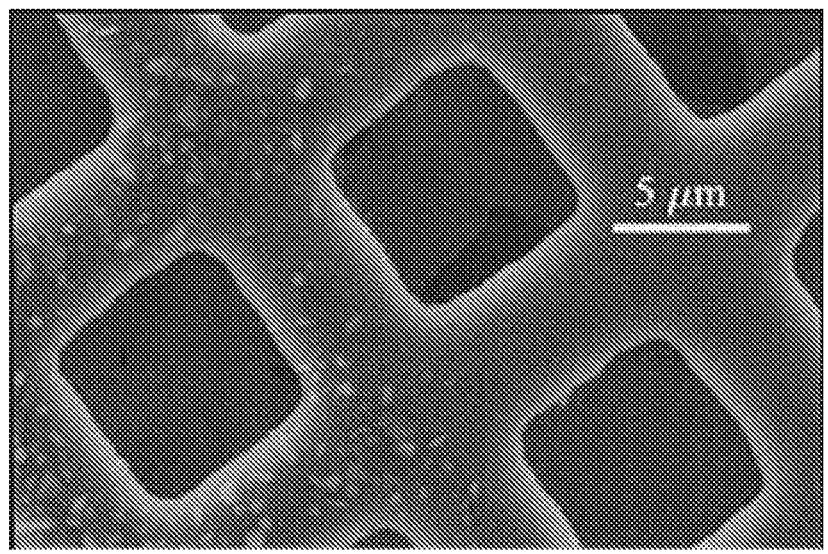
FIG. 17 is an SEM image of pristine freestanding graphene between Cu rail supports.

Monolayer graphene, commercially grown on Ni (less than 10% is multilayer graphene), was directly transferred to a 2000-mesh, ultrafine copper grid having a lattice of square holes 7.5 μm wide with bar supports 5 μm wide. Scanning electron microscopy (SEM) images show 90% coverage of the copper grid by the graphene (FIG. 17). An Omicron ultrahigh vacuum (base pressure is 10-10 mbar) low-temperature scanning tunneling microscope, operated at room temperature, was used for the height measurements. The graphene film was mounted toward the sample plate on standoffs, so the scanning tunneling microscope tip approached through the holes of the grid, in order to provide a more stable support. The entire scanning tunneling microscopy chamber rests on an active, noise canceling, vibration isolation system and is powered using a massive battery bank with an isolated building ground to achieve exceptionally low electrical noise.

Data were acquired using scanning tunneling microscopy tips fabricated in-house, under constant-current (feedback on) tunneling conditions, and the topography scan set to point mode (no x or y scanning). The system was adapted to allow 16-bit data to be continuously recorded for both the actual tunneling current and the tip height at a rate of 800 Hz for a time span of $10^4$ s, yielding $8 \times 10^6$ data points per channel. The scanning tunneling microscopy tip-sample drift was independently monitored, and the results indicated that the drift was nonstochastic and less than 1 nm/hr. Data was collected from multiple membranes for fixed imaging conditions spanning several orders of magnitude in tunneling current (0.01-10 nA) and bias voltage (0.01-10 V), all at room temperature. When imaging the graphene surface with atomic resolution, only monolayer graphene that is free of defects over a scale of microns was observed.

Figure 18:
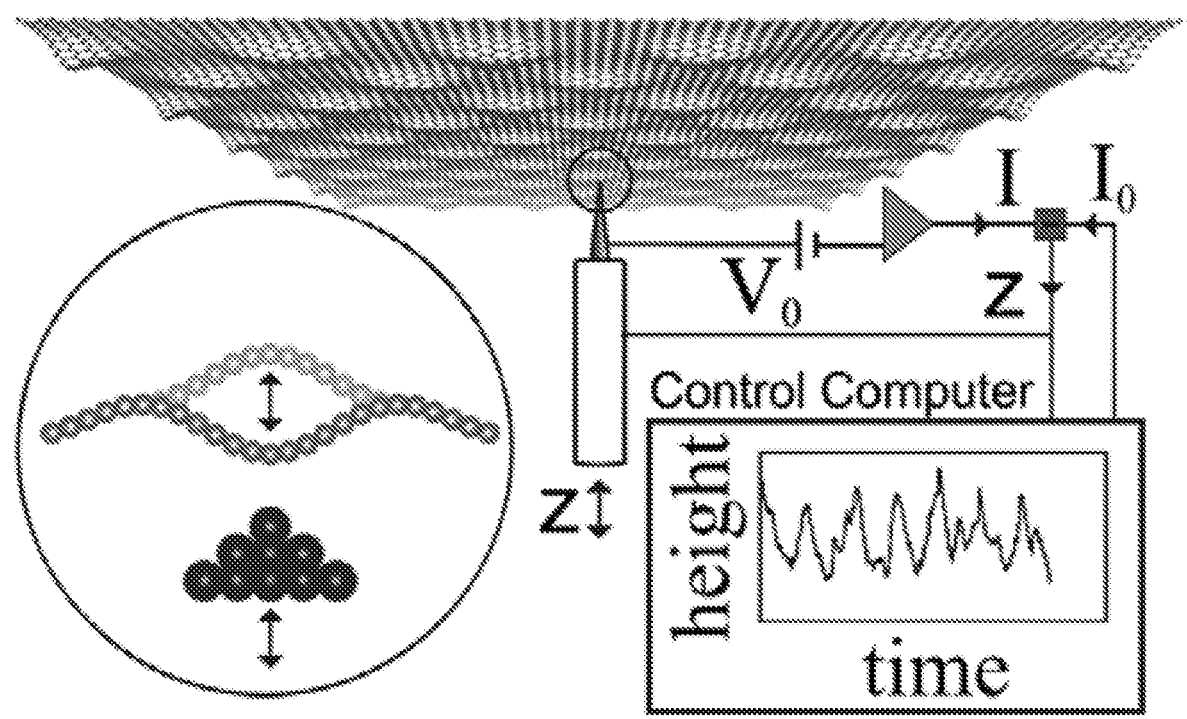
FIG. 18 is a schematic diagram of experimental setup.
Figure 19:
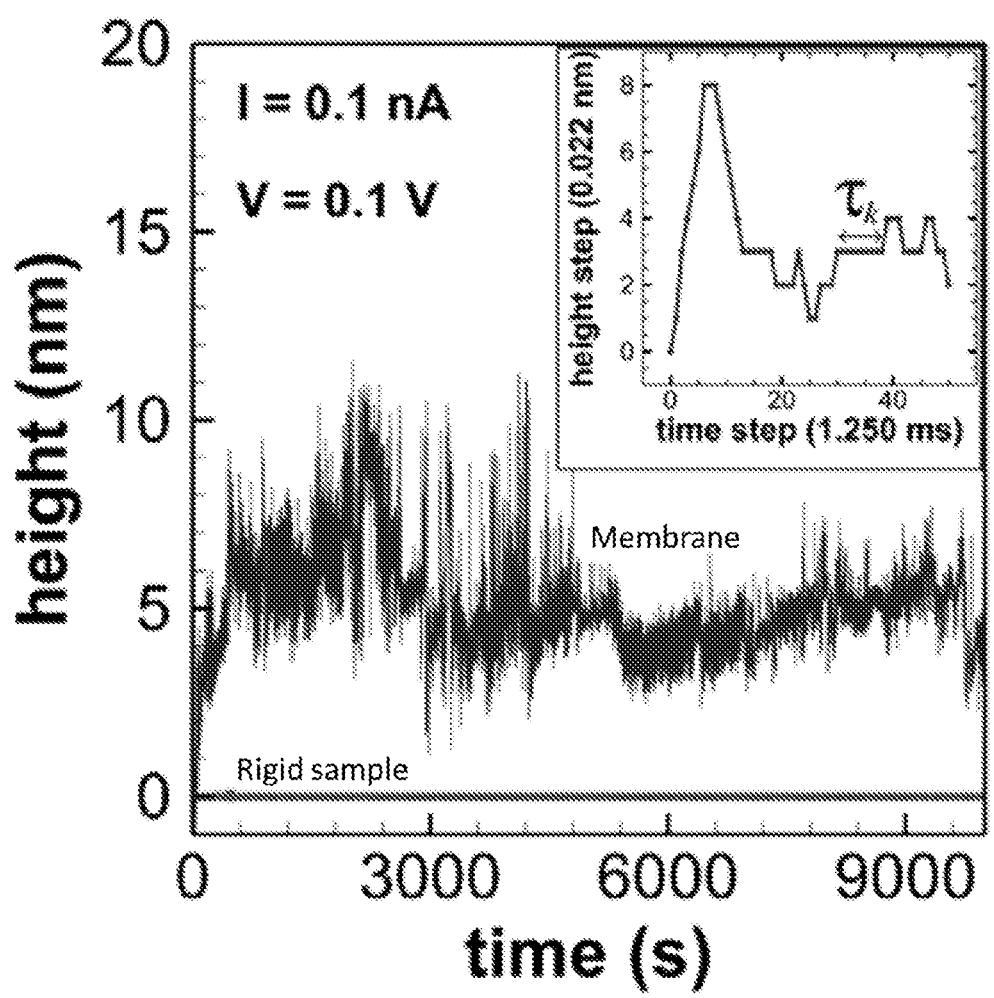
FIG. 19 shows a typical time trace of membrane height (above) and from a rigid sample (below). The inset is an expanded view of the freestanding graphene time trace.
Figure 20:
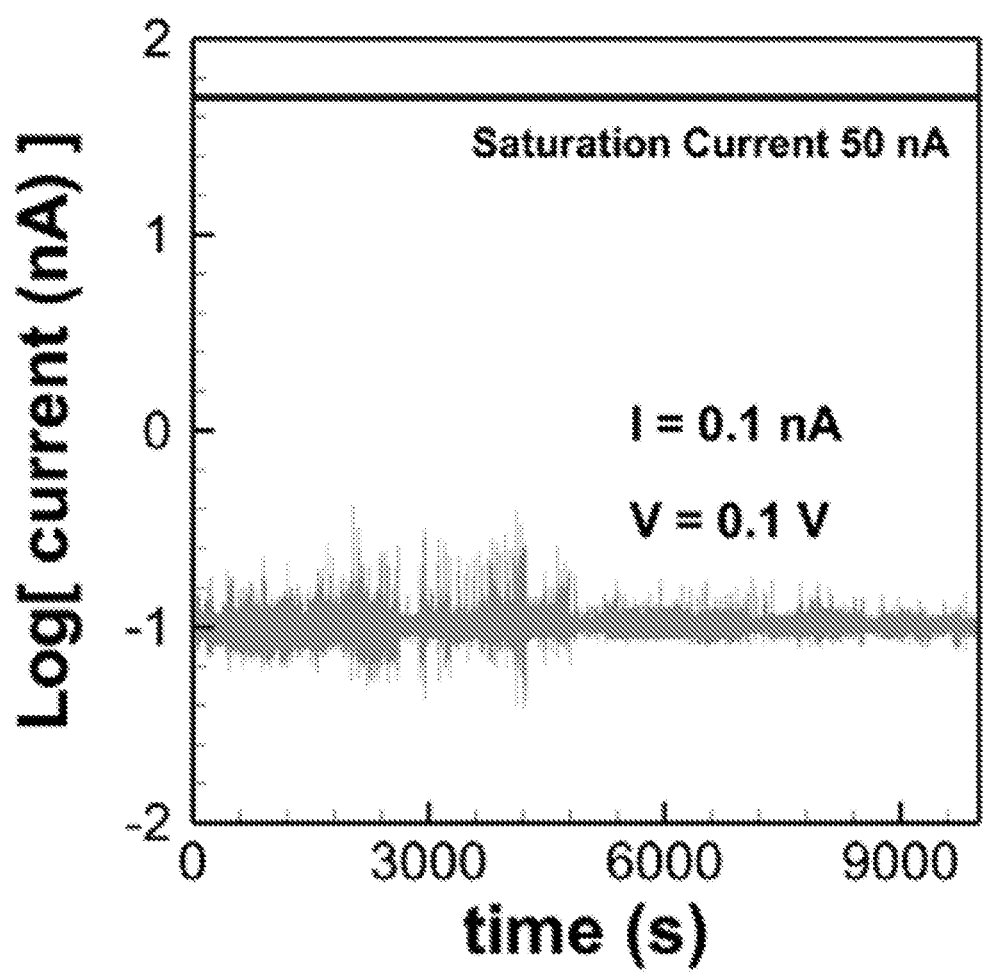
FIG. 20 shows a typical tunneling current profile during the measurement.

A schematic of the experimental setup is shown in FIG. 18. A biased scanning tunneling microscopy tip, mounted at the end of a piezoelectric tube scanner, approaches the electrically grounded freestanding graphene membrane from below. A typical time series for z(t) is shown in FIG. 19 for scanning tunneling microscopy setpoint (I=0.1 nA, V=0.1 V). The range of membrane movement (~10 nm) is enormous for point-mode scanning tunneling microscopy, and for comparison a typical scanning tunneling microscopy trace acquired from a rigid sample is also shown. Such large values of z(t) appear reasonable as the unsupported graphene membrane forms a rippled structure that shifts continuously between a large number of energetically equivalent configurations (Meyer J C et al. *Nature (London)* 2007, 446, 60; Los J H et al. *Phys. Rev. B* 2009, 80, 121405(R)). The inset of FIG. 19 shows a zoomed-in plot of membrane height (in units of $\delta_o$=0.022 nm) as a function of time (in units of $\tau_o$=1.250 ms) with the typical time between two successive jumps (i.e., a change in the height) is labeled as $\tau_k$. The wait-time probability distribution for this data was calculated and follows a simple exponential, showing that it is a Poisson process. The measured tunneling current in FIG. 20, corresponding to the data shown in FIG. 19, remained well below the saturation level and well above zero, even when the membrane height changed significantly. The contribution of tip-sample distance variation to the membrane height z(t) was negligible for all of the data. In addition, the cross-correlation coefficient between the measured height and tunneling current is less than 0.05.

Figure 21:
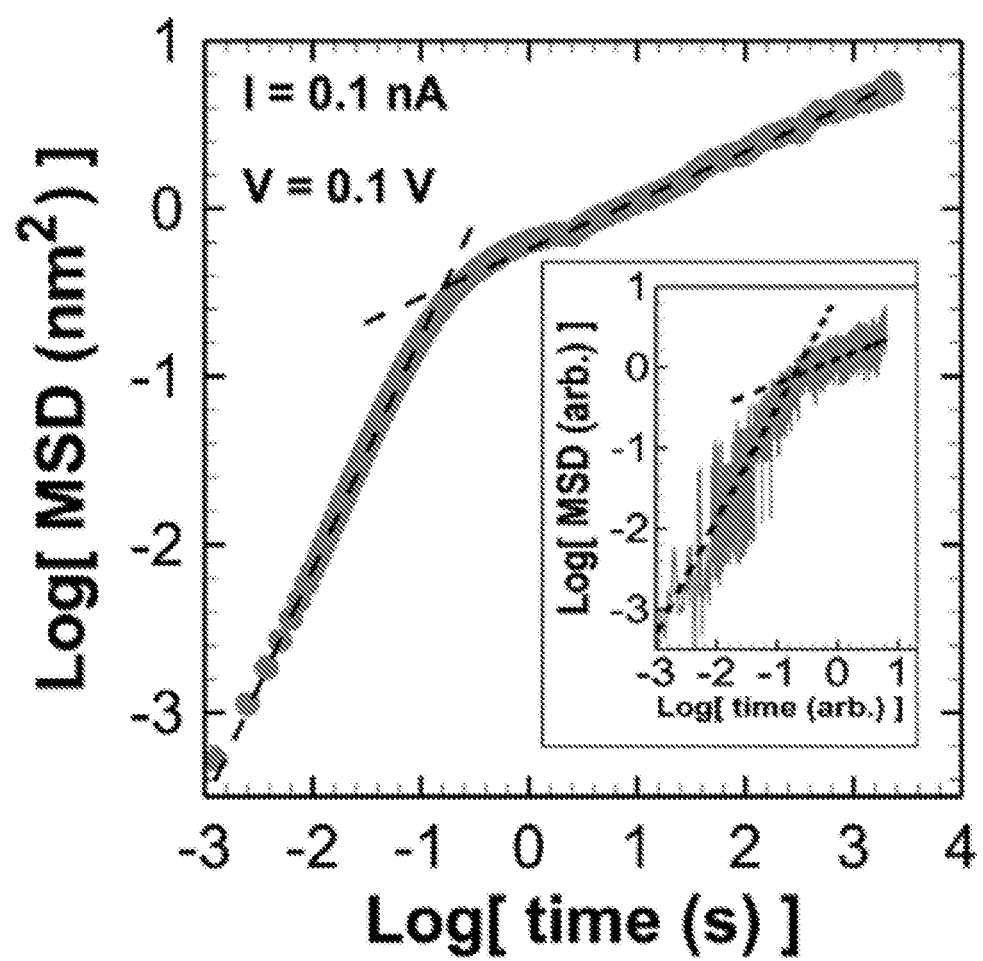
FIG. 21 is the mean-squared displacement (MSD) of membrane height as a function of time. Dashed lines are fits with slopes 1.4 and 0.3. The inset is the result of a simulation using exponential wait times and Cauchy jump lengths. Again, the dashed lines are fits with slopes 1.4 and 0.3.

From the time series z(t), the mean-squared displacement was computed according to the following equation: MSD $(\tau) \equiv \langle [z(t+\tau)-z(t)]^2 \rangle$, the result of which is shown in FIG. 21. These data, spanning nearly 7 orders of magnitude in time, are characterized by a power law dependence of MSD$(\tau) \sim \tau_\alpha$ with $\alpha \neq 1$ being the anomalous diffusion exponent. For this data, the motion at short times is characterized by $\alpha=1.4$ (superdiffusive motion) followed by a range for which $\alpha=0.3$ (subdiffusive motion). The same exponents were observed with other data sets acquired at different tunneling setpoints. A random walk simulation, using exponential wait times and Cauchy jump lengths, yields a MSD with superdiffusion for short times and subdiffusion for long times, as shown in the inset of FIG. 21. Experimental evidence for a Cauchy distribution also comes from the membrane velocity.

Figure 22:
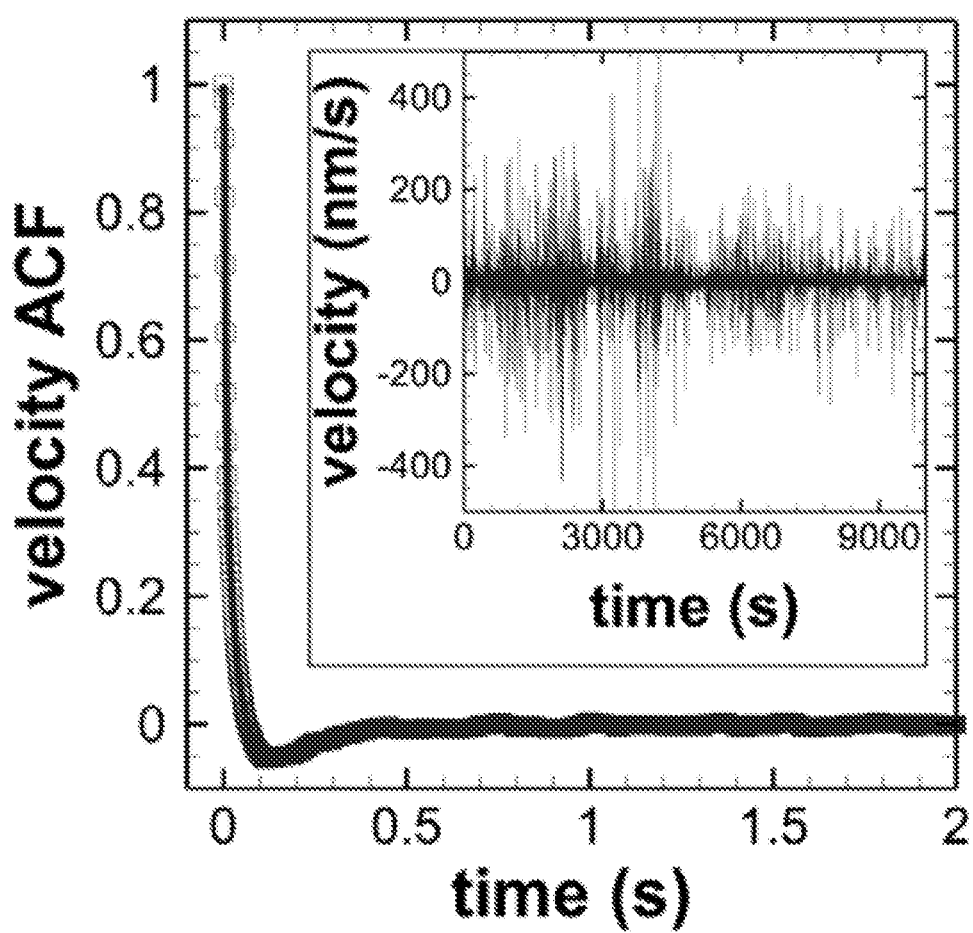
FIG. 22 is the velocity autocorrelation function (ACF) and instantaneous velocity (inset) computed from membrane height z(t) shown in FIG. 19.

The instantaneous membrane velocity, computed numerically from the time series for z(t), shown in FIG. 19, displays highly irregular behavior [inset of FIG. 22] with a short memory. The velocity autocorrelation function, VACF($\tau$)≡ $\langle v(t)v(t+\tau)\rangle$, shown in FIG. 22, decreases rapidly, becoming negative around 0.1 s, indicative of a liquidlike behavior, before finally decaying to zero (within 0.5 s of the 10,000 s long measurement), showing that the membrane velocity fluctuations are quickly decorrelated. This observation demonstrates that it is possible to measure the equilibrium velocity distribution using scanning tunneling microscopy, which derives support from other studies of single-atom diffusion using scanning tunneling microscopy (Swartzentruber B S. *Phys. Rev. Lett.* 1996, 76, 459).

Figure 23:
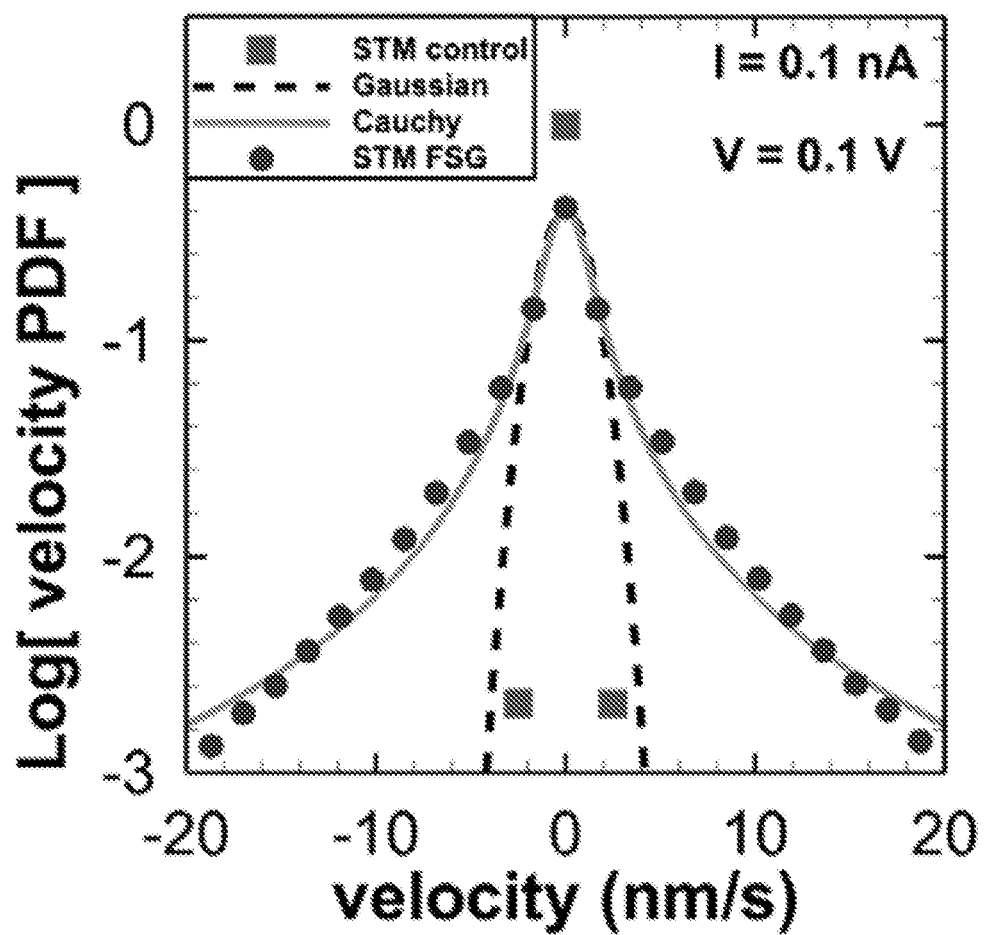
FIG. 23 is the measured freestanding graphene (FSG) membrane velocity probability distribution function (PDF) fitted to Cauchy-Lorentz and Gaussian distributions, along with the rigid control sample (square symbols).

FIG. 23 shows the membrane velocity probability distribution function (PDF) computed from the data shown in FIG. 19. The solid curve is the best-fit Cauchy-Lorentz distribution with zero mean velocity, $v_o=0$, and FWHM 2$\Gamma$:

$$\mathcal{L}(v;\Gamma) = \frac{1/\pi\Gamma}{1+[(v-v_o)/\Gamma]^2}$$

The velocity distribution peaks at zero and is symmetric about it, consistent with an equal likelihood of the membrane moving up or down (i.e., balanced movement in the presence of the scanning tunneling microscopy tip), and indicates that the system is within the elastic limit for the bias voltage setpoints.

Figure 24:
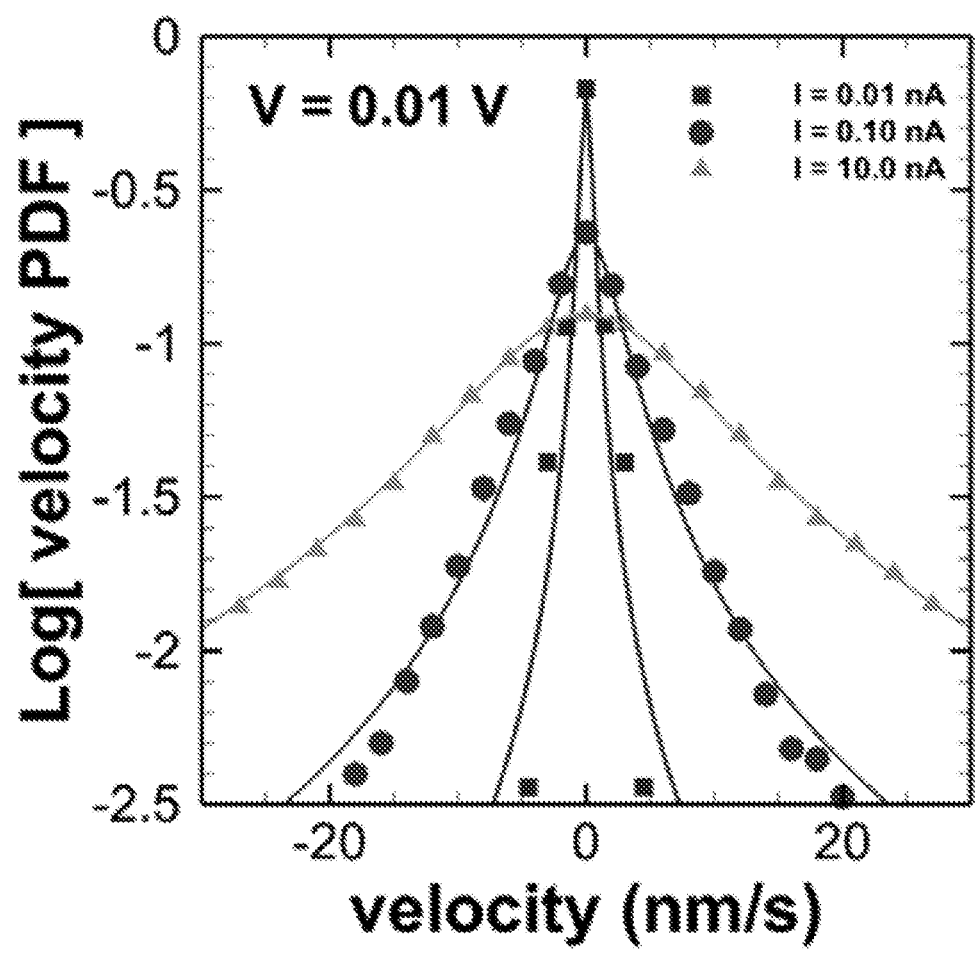
FIG. 24 is the velocity probability distribution functions and Cauchy-Lore (full curves) for different tunneling currents.

Even though membrane velocities as high as 500 nm/s were observed, 98% of all velocities fall in the range of from −15 nm/s to 15 nm/s (FIG. 23). The dashed curve in FIG. 23 is the best-fit Gaussian. The data in FIG. 23 clearly follow a Cauchy-Lorentz distribution rather than a Gaussian, especially for speeds greater than 10 nm/s. Three data points (squares) are for the rigid sample data shown in FIG. 19 are shown for comparison in FIG. 23. FIG. 24 shows the membrane velocity probability distribution function data for tunneling currents spread over many orders of magnitude along with best-fit Cauchy-Lorentz distributions. These velocity distributions were obtained from scanning tunneling microscopy data taken from a new location on the sample with increasing tunneling current. The most striking conclusion is that, in all cases, the membrane velocities follow a Cauchy-Lorentz distribution (i.e., a Lévy stable distribution with infinite variance and stability index 1) much better than a Gaussian.

Figure 25:
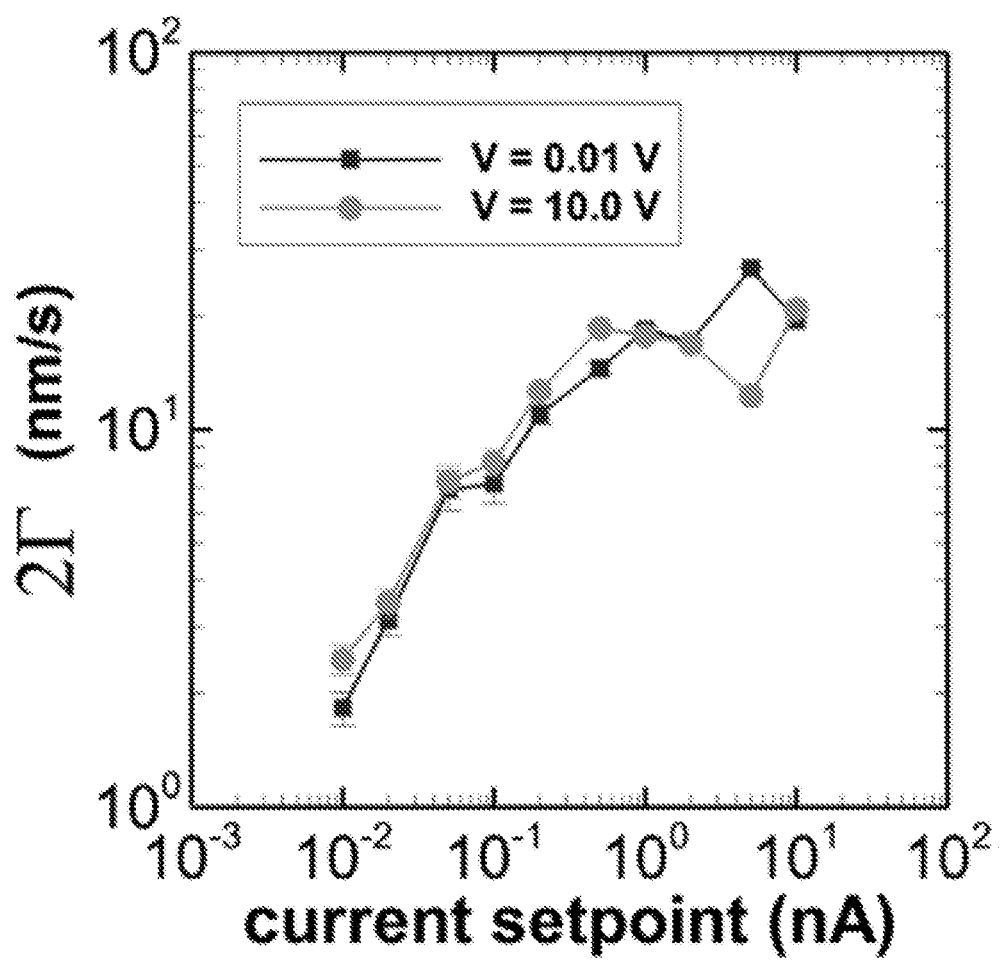
FIG. 25 is the variation in the FWHM of the velocity probability distribution functions with tunneling current for two different bias voltage setpoints.

It can further be seen from FIG. 24 that the velocity distribution broadens with increasing tunneling current. The same trend is apparent in FIG. 25, which shows the variation of the FWHM of the velocity probability distribution function with the tunneling current setpoint over the entire range of this study. The broadening of the distribution is consistent with Joule heating due to the scanning tunneling microscopy tunneling current providing more kinetic energy to the membrane (Neek-Amal M et al. *Nat. Commun.* 2014, 5, 4962).

Elasticity theory predicts the vibrational modes of free-standing graphene; however, it does not yield information about the stochastic processes underlying a disordered network of ripples found in compressed 2D membranes. Atomistic simulations can provide insight into the observed phenomenon. For the molecular dynamics (MD) simulations herein, a prebuckled, curved down square membrane (15×15 nm$^2$) containing 10 000 carbon atoms with boundary atoms fixed was prepared (no scanning tunneling microscopy tip).

The simulations in vacuum were performed in LAMMPS using the AIREBO potential. A Nosé-Hoover thermostat was used to maintain a constant temperature and the equations of motions were integrated using a time step of 1 fs. The system was first equilibrated for 0.5 ns starting from the initial configuration, and the subsequent trajectory from a production run of 1 ns was used for the analysis.

Figure 26:
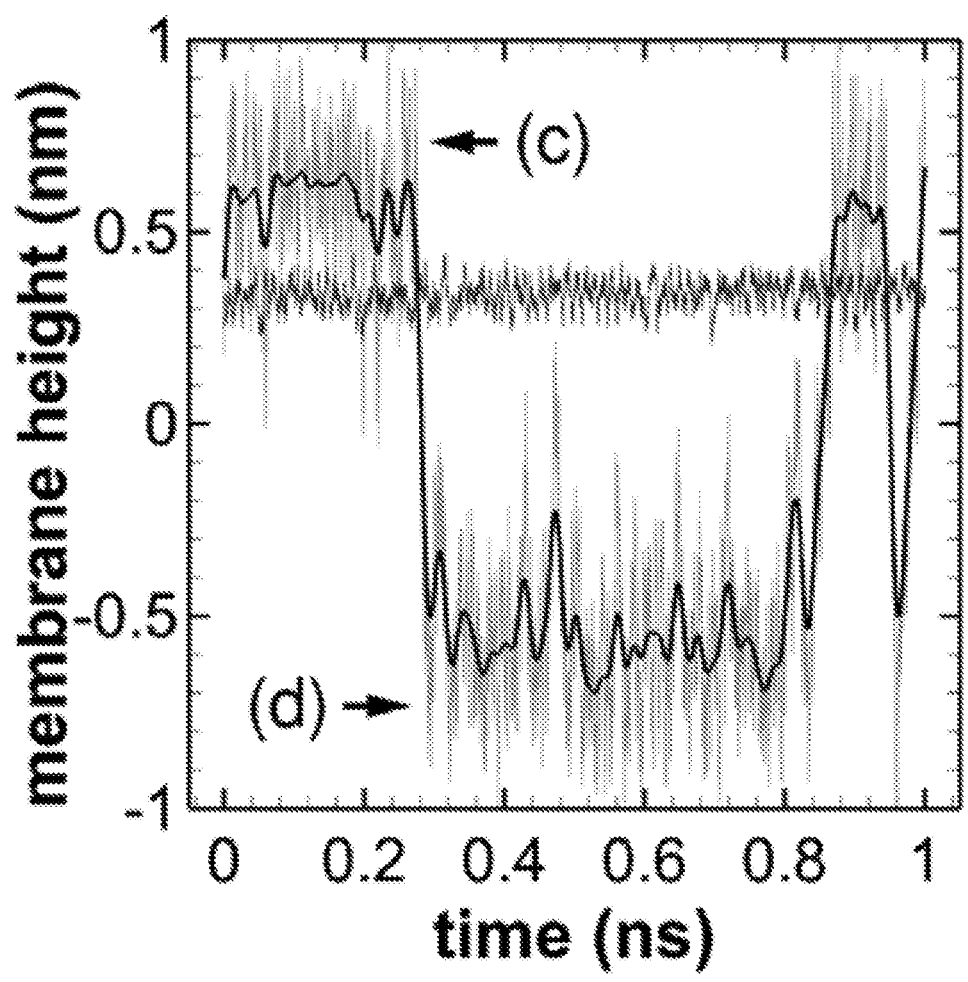
FIG. 26 is the height of the central carbon atom in time from MD simulation for low temperatures (100 K) and high temperatures (3000 K). The high-temperature data are found to transition from positive to negative heights four times over 1 ns. A low-pass filtered height is also shown. These calculations were performed using temperature accelerated dynamics (TAD), where 1 ns of computing time is 1 ms in real time.
Figure 27:
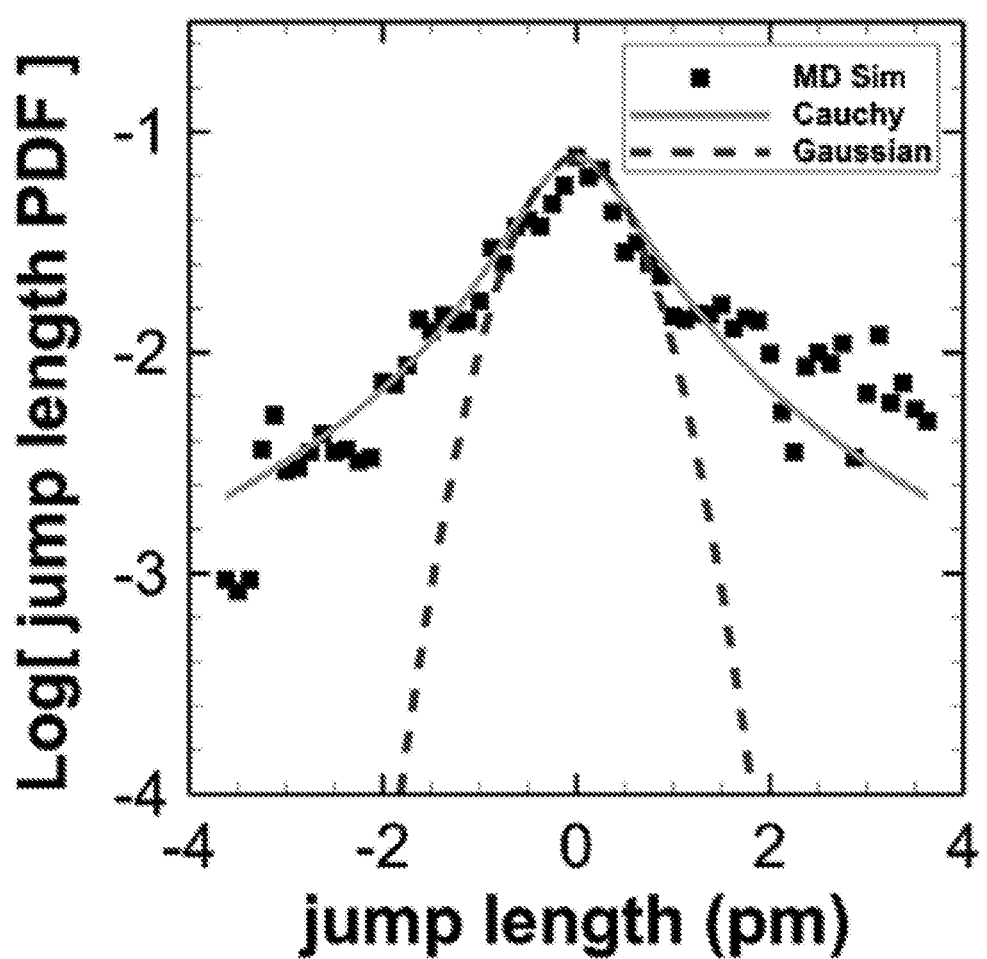
FIG. 27 is the jump length probability distribution function for the low-pass filtered height data is shown with a best fit to Cauchy-Lorentz and Gaussian distributions.
Figure 28:
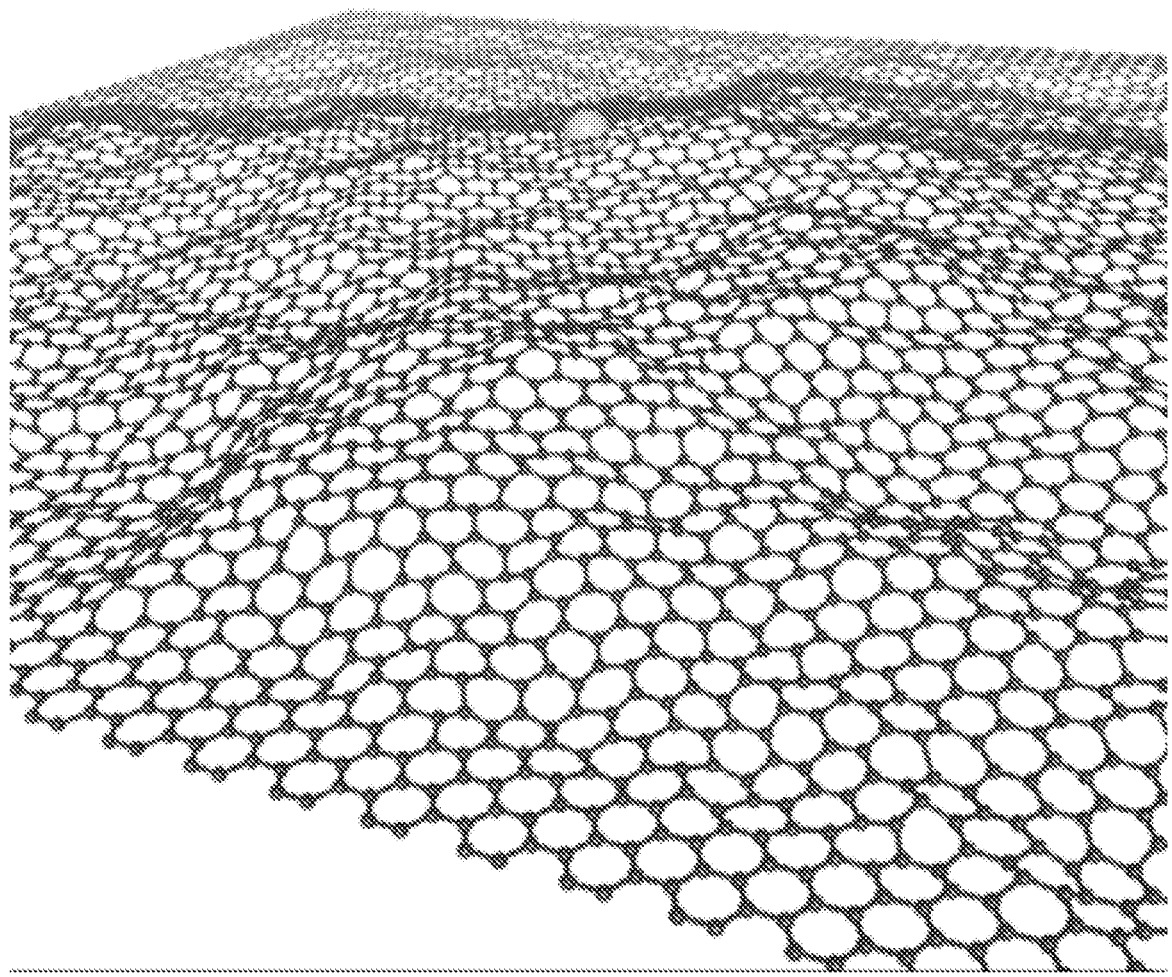
FIG. 28 is a perspective view of the membrane in a curved down shape marked as "(c)" in FIG. 26.
Figure 29:
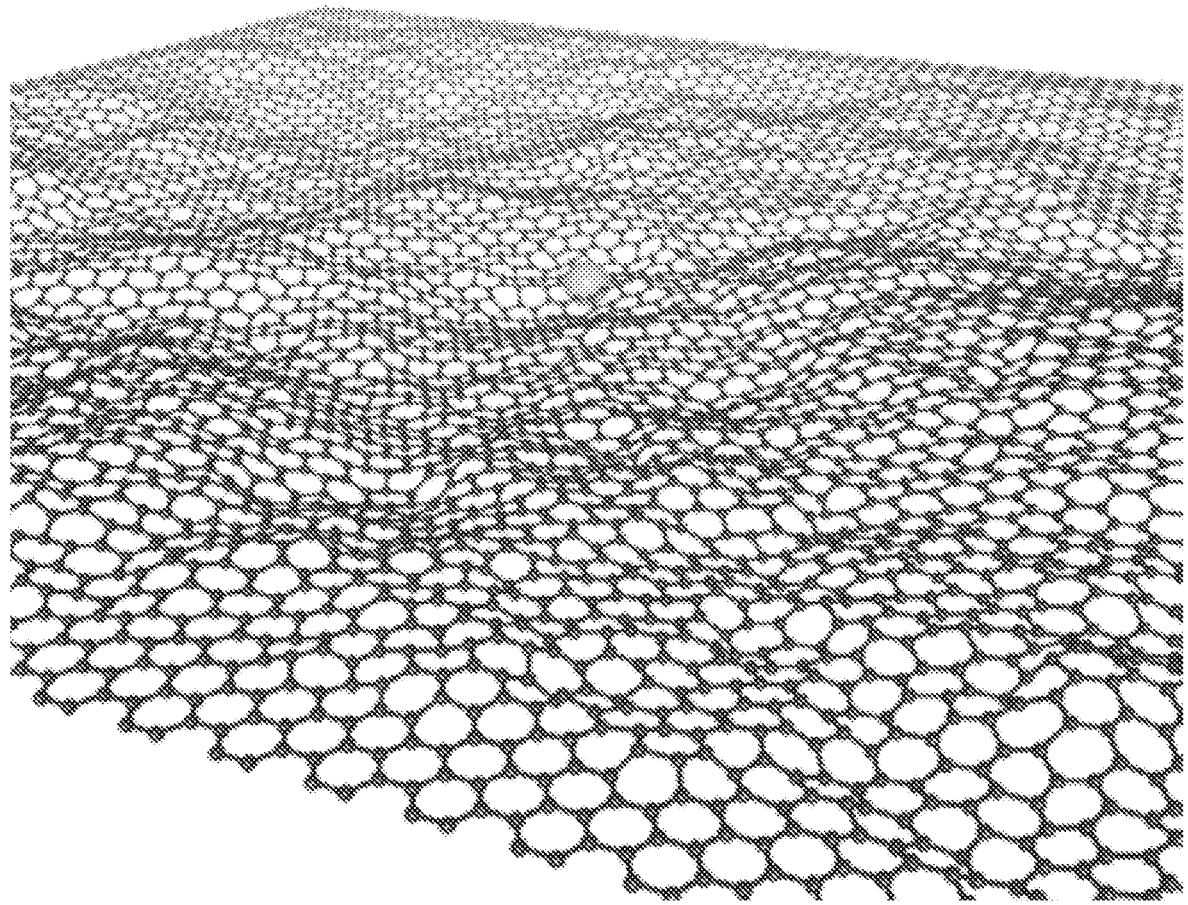
FIG. 29 is a perspective view of the membrane in a curved up marked as "(d)" in FIG. 26.
Figure 30:
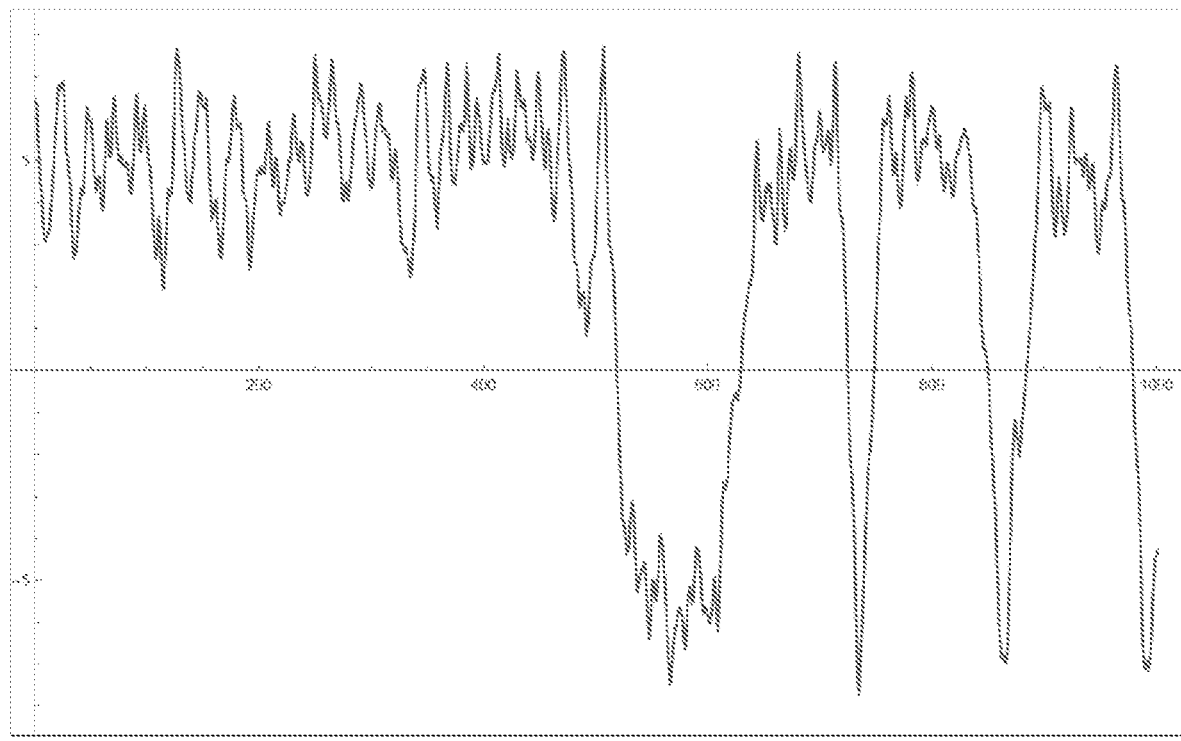
FIG. 30 is the output reported from state-of-the-art molecular dynamics simulations using LAMMPS, showing the height-time data for pre-buckled freestanding graphene.

The movement of the central atom with 10$^6$ time steps (1 per fs) at low temperature (100 K) shows 0.1 nm height fluctuations at an overall height of 0.35 nm above the fixed boundary atoms, as shown in FIG. 26. At higher temperatures (3000 K) something significantly different happens. At the same time scale, the random movement results in mirror buckling of the entire membrane from above the fixed boundary atoms to below them. FIG. 28 and FIG. 29 show two snapshots of the membrane for opposite configurations labeled (c) and (d) in FIG. 26. The long excursion from curved down to curved up is indicative of Lévy walks. In fact, if the data in FIG. 26 is averaged over a short time interval to smooth out rapid fluctuations [black curve in FIG. 26], a Cauchy jump length distribution is obtained, as shown in FIG. 27. Time averaging of the very high frequency movement of graphene is exactly what the scanning tunneling microscopy measurement would yield. Similar Cauchy distributions are also obtained for a spatial average about the central atom, which would also naturally occur with any real measurement having resolution greater than 1 nm. An additional simulation is shown in FIG. 30. Here, the system appears to spontaneously oscillate during the second half on the simulation.

This large-scale movement is a consequence of graphene locally changing its overall curvature (e.g., a curved down to curved up transition), while the small-scale movements are simple vibrations of the membrane with no inversion of its curvature. How this happens can be tracked in the high-temperature simulation: the random up and down movement at times add together in the same direction resulting in a long excursion to another equilibrium configuration on the other side of the fixed boundary atoms. Given that four such events happen in 1 ns at 3000 K, one can predict that these events will happen several times for scanning tunneling microscopy measurements carried out at room temperature (Sorensen M R and Voter A F. *J. Chem Phys.* 2000, 112, 9599). Thus, the data shows that spontaneous mirror buckling can occur without a temperature gradient.

These measurements uncover an unexplored spatial and temporal domain in membrane fluctuations with profound implications both for fundamental understanding and technological applications of membranes. Properly understood, the random membrane fluctuations can be usefully exploited. For example, energy harvesting from the continuous movement of a massive system is an important application of stochastic nanoresonators (Gammaitoni L et al. *Rev. Mod Phys.* 1998, 70, 223).

By tuning the velocity distribution (for example, by varying the tunneling current), one can activate certain processes and deactivate others. Furthermore, as the membrane flexes, it modifies the local strain, the chemical reactivity, and the charge distribution, which allows the system to do work. Engineering specific channel geometries in a membrane, along with complementary ratchet-style components, could create small artificial Lévy motors (Haenggi P and Marchesoni F. *Rev. Mod. Phys.* 2009, 81, 387). Finally, advances in the understanding of membrane dynamics can help control the motion of objects over the membrane, which is critical to protein function, as well as the self-organization of artificial materials.

In summary, dynamics of atomic-scale fluctuations of a freestanding graphene membrane were studied using point-mode scanning tunneling microscopy and molecular dynamics simulations. The measurements reveal the richness of the random out-of-plane motion of membranes, which exhibits anomalous dynamics and long-tail equilibrium distributions of dynamical variables symptomatic of Lévy walks. It was also demonstrated that stochastic properties of fluctuating membranes can be controlled using scanning tunneling microscopy. This, coupled with the ability to observe motion with atomic-scale resolution, provides a system to study new Brownian motion regimes and test various models of anomalous transport. In conclusion, buckling events in 2D materials were experimentally and theoretically demonstrated to yield artificial crystalline membranes with tunable Lévy walks. Ultimately, this study provides methods to predict, control, and even minimize the occurrence of large-scale, sudden changes in a wide variety of systems.

Example 2

Figure 14:
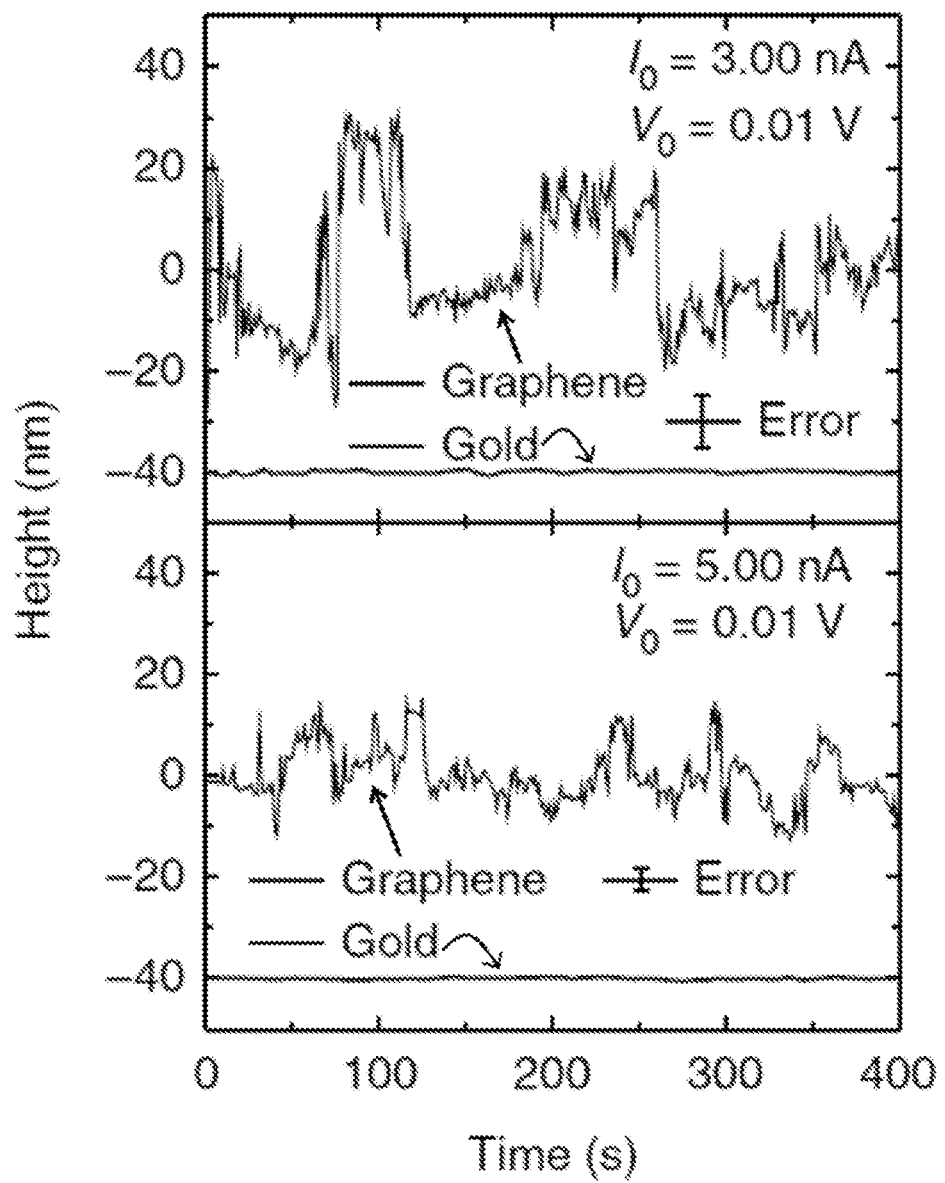
FIG. 14 is the height changes in freestanding graphene over time.
Figure 15:
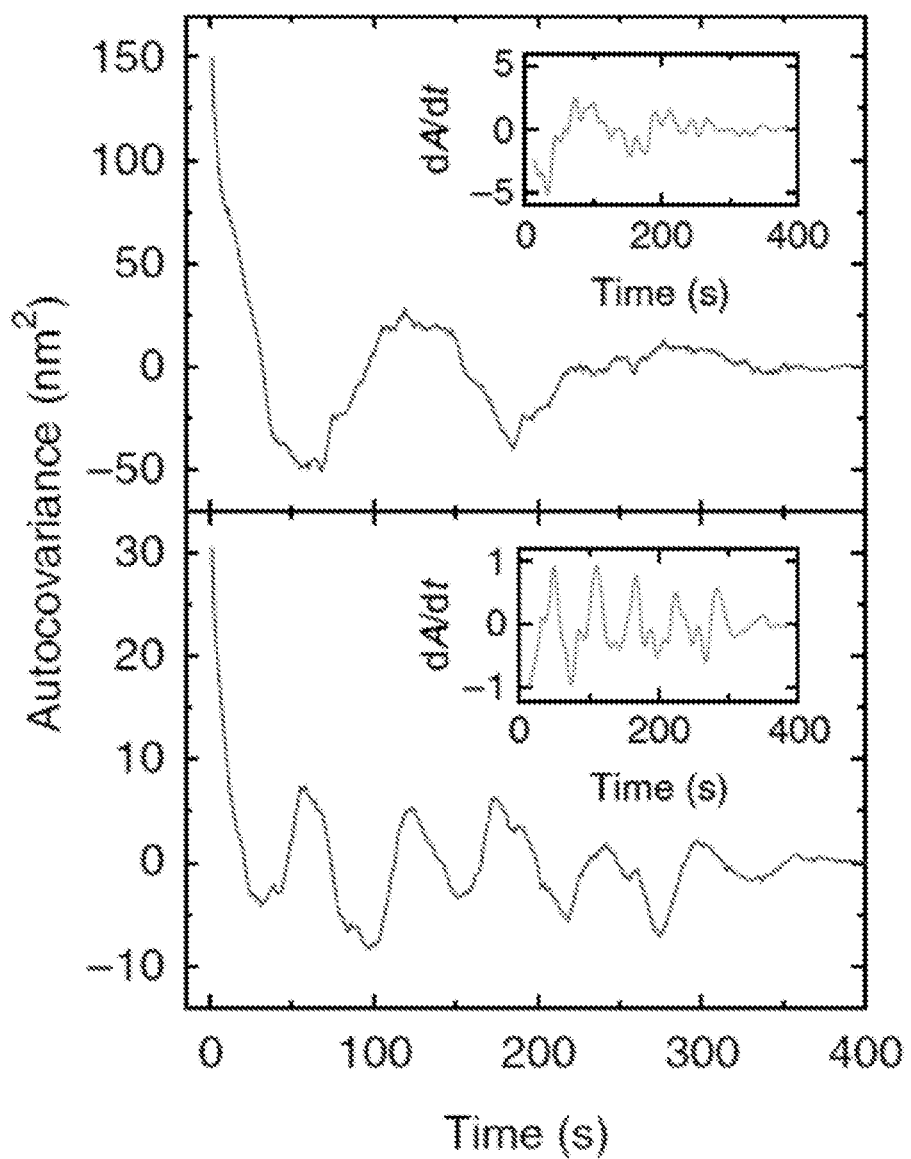
FIG. 15 is the autocorrelation of the height-time data from FIG. 14.
Figure 16:
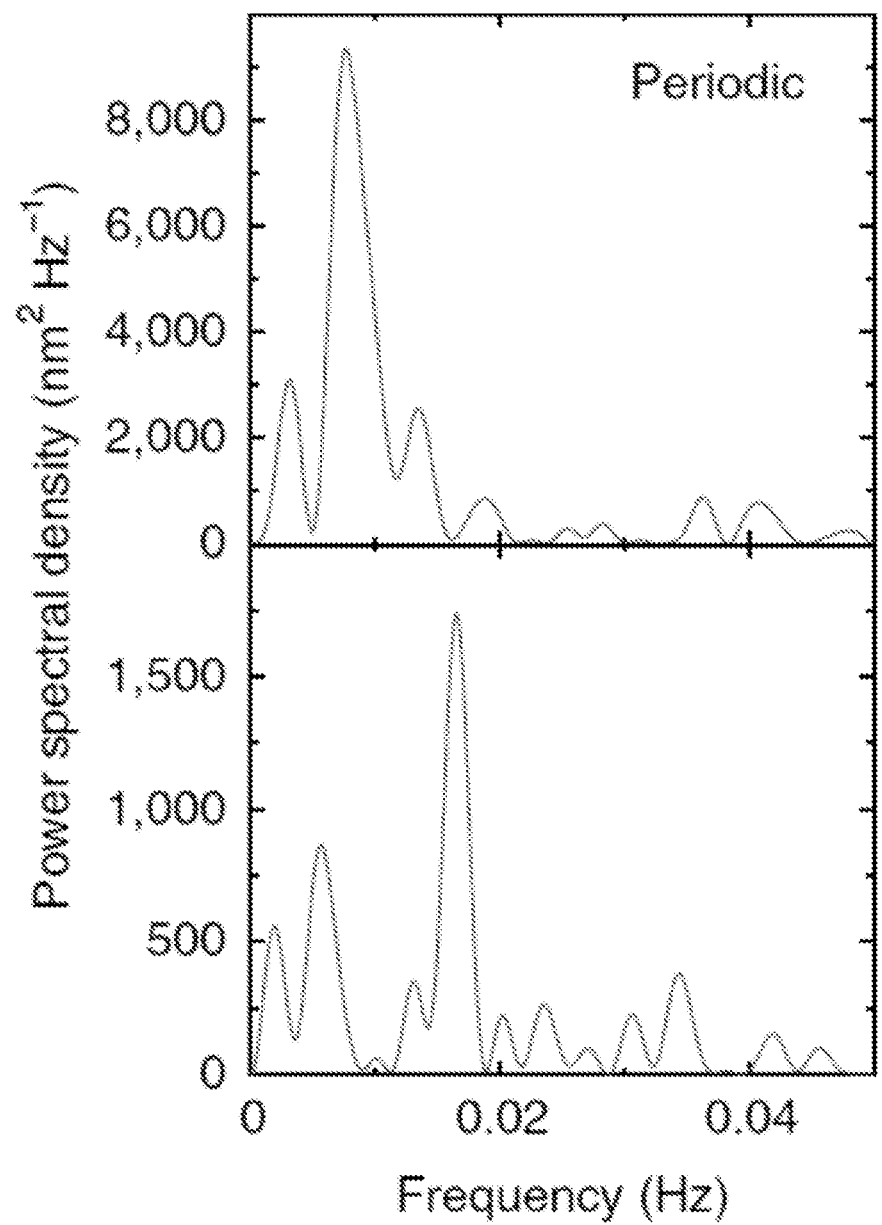
FIG. 16 is the power spectral density calculated from the data from FIG. 14 and FIG. 15.

A scanning tunneling microscope can also be used to measure height changes of the freestanding graphene in time [FIG. 14]. From this information, velocity in time can be calculated to generate a velocity probability distribution function (PDF). The velocity PDF can exhibit a non-Gaussian shape and have anomalously large velocities. In addition, patterns in the height-time can be found by calculating the autocorrelation function of the height-time data [FIG. 15] and dominate frequency can be found by calculating the power spectral density [FIG. 16], which shows ultra-low frequency can occur.

Other advantages which are obvious and which are inherent to the invention will be evident to one skilled in the art. It will be understood that certain features and sub-combinations are of utility and may be employed without reference to other features and sub-combinations. This is contemplated by and is within the scope of the claims. Since many possible embodiments may be made of the invention without departing from the scope thereof, it is to be understood that all matter herein set forth or shown in the accompanying drawings is to be interpreted as illustrative and not in a limiting sense.

The methods of the appended claims are not limited in scope by the specific methods described herein, which are intended as illustrations of a few aspects of the claims and any methods that are functionally equivalent are intended to fall within the scope of the claims. Various modifications of the methods in addition to those shown and described herein are intended to fall within the scope of the appended claims. Further, while only certain representative method steps disclosed herein are specifically described, other combinations of the method steps also are intended to fall within the scope of the appended claims, even if not specifically recited. Thus, a combination of steps, elements, components, or constituents may be explicitly mentioned herein or less, however, other combinations of steps, elements, components, and constituents are included, even though not explicitly stated.

What is claimed is:

1. An energy harvesting device comprising:
a membrane disposed on a substrate having a thermally conductive grid of apertures, the apertures each having an open frame supporting freestanding portions of the membrane within each open frame, wherein the membrane comprises a two-dimensional (2D) material exhibiting vibration in the presence of thermal energy thereon;
a plurality of ripples in the membrane resulting from the vibration, the ripples comprising curved up ripples and curved down ripples;
wherein the membrane exhibits an electrical charge and vibrational energy in the presence of thermal energy from the substrate;
wherein atoms of the membrane move together during the vibration; and
wherein the atoms are connected together in a network causing the entire membrane to form the plurality of ripples and invert the curvature of the ripples to opposite configurations; and
a component electrically, magnetically, and/or mechanically coupled to the membrane and/or the substrate, such that the component is configured to harvest energy from the membrane.

2. The device of claim 1, wherein the two-dimensional material comprises graphene, $MoS_2$, $MoSe_2$, $WS_2$, $WSe_2$, $ReS_2$, $ReSe_2$, or a combination thereof.

3. The device of claim 1, wherein the two-dimensional material comprises graphene.

4. The device of claim 1, wherein the membrane has an average thickness of from 0.3 nm to 3.0 nm, from 0.3 nm to 2.0 nm, from 0.3 nm to 1.0 nm, or from 0.3 nm to 0.6 nm.

5. The device of claim 1, wherein the membrane has an average lateral dimension of from 0.1 microns to 100 microns.

6. The device of claim 1, wherein the membrane has a tension of from 0.0 to 10.0 N/m, from 0.0 N/m to 5.0 N/m, from 0.0 N/m to 1.0 N/m, from 0.0 to 0.5 N/m, from 0.0 to 0.3 N/m, or from 0.03 N/m to 0.12 N/m.

7. The device of claim 1, wherein the one or more ripples has an average length of from 1 nm to 100 nm, from 1 nm to 80 nm, from 5 nm to 50 nm, from 10 nm to 40 nm, or from 20 nm to 30 nm.

8. The device of claim 1, wherein the plurality of ripples has an average height of from 0.1 nm to 2.0 nm, from 0.1 nm to 1.0 nm, from 0.20 nm to 0.60 nm, from 0.30 nm to 0.50 nm, or from 0.35 nm to 0.45 nm.

9. The device of claim 1, wherein the substrate comprises copper, silicon, silicon carbide, sapphire, or a combination thereof.

10. The device of claim 1, wherein the thermal energy of the substrate is converted into the vibration of the membrane such that the membrane has a vibrational energy, and the component is configured to convert the vibrational energy of the membrane into electrical, magnetic, and/or mechanical energy, thereby harvesting energy from the membrane.

11. The device of claim 10, wherein the thermal energy comprises ambient thermal energy.

12. The device of claim 10, wherein the vibrational energy comprises vibrations having a frequency of from 0.1 milli-Hertz to 10 GigaHertz.

13. The device of claim 10, wherein the component comprises a capacitor disposed around and electrically coupled to the membrane, wherein the capacitor is configured to convert the vibrational energy of the charged membrane into an alternating electrical current, thereby harvesting energy from the membrane.

14. The device of claim 13, wherein the device further comprises a diode bridge circuit to convert the alternating electrical current into a direct electrical current.

15. The device of claim 14, wherein the device further comprises a capacitor electrically coupled to the diode bridge, such that the direct current can charge the capacitor, thereby storing the charge generated by the vibrational energy of the charged membrane.

16. The device of claim 1, wherein each of the one or more ripples can produce a power of from 1 pW to 100 pW.

17. The device of claim 1, wherein the energy harvesting device has a power density of from 1 $W/m^2$ to 100,000 $W/m^2$.

* * * * *